United States Patent
Yoshida et al.

(10) Patent No.: US 12,410,903 B2
(45) Date of Patent: Sep. 9, 2025

(54) LIGHT EMITTING MODULE

(71) Applicant: NICHIA CORPORATION, Anan (JP)

(72) Inventors: Norimasa Yoshida, Komatsushima (JP); Tsuyoshi Okahisa, Tokushima (JP); Saiki Yamamoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/710,729

(22) PCT Filed: Nov. 30, 2022

(86) PCT No.: PCT/JP2022/044189
§ 371 (c)(1),
(2) Date: May 16, 2024

(87) PCT Pub. No.: WO2023/145248
PCT Pub. Date: Aug. 3, 2023

(65) Prior Publication Data
US 2025/0035287 A1 Jan. 30, 2025

(30) Foreign Application Priority Data
Jan. 27, 2022 (JP) .................................. 2022-011251

(51) Int. Cl.
*F21V 14/02* (2006.01)
*F21V 5/00* (2018.01)
(Continued)

(52) U.S. Cl.
CPC .............. *F21V 14/02* (2013.01); *F21V 5/002* (2013.01); *F21V 5/048* (2013.01); *F21V 19/003* (2013.01); *F21Y 2113/13* (2016.08)

(58) Field of Classification Search
CPC ....... F21V 14/02; F21S 10/026; F21S 10/046; F21S 41/657
See application file for complete search history.

(56) References Cited

U.S. PATENT DOCUMENTS

2014/0133142 A1\* 5/2014 Jorgensen ................. F21V 5/04
362/232
2015/0022085 A1 1/2015 Dross
(Continued)

FOREIGN PATENT DOCUMENTS

CN 208058450 U 11/2018
JP 2005-121872 A 5/2005
(Continued)

OTHER PUBLICATIONS

International Search Report and Written Opinion of the International Searching Authority with English language translations issued in the corresponding International Patent Application No. PCT/JP2022/044189, dated Feb. 7, 2023.

*Primary Examiner* — Sean P Gramling
(74) *Attorney, Agent, or Firm* — Foley & Lardner LLP

(57) ABSTRACT

A light emitting module includes: a substrate; a plurality of light sources fixed on the substrate and generating individually controllable outputs; a light shielding member disposed between the light sources; a first lens that is disposed above the light sources and on which the light emitted from each of the light sources becomes incident; and a drive unit capable of rotating the substrate. The light sources include a first light source and a second light source. The angle formed by the axis of rotation of the substrate and the optical axis of first light emitted by the first light source and exiting the first lens differs from the angle formed by the axis of rotation and the optical axis of second light emitted by the second light source and exiting the first lens. The second light can irradiate a first circular track having the axis of rotation as its center.

20 Claims, 22 Drawing Sheets

(51) Int. Cl.
    *F21V 5/04*    (2006.01)
    *F21V 19/00*    (2006.01)
    *F21Y 113/13*    (2016.01)

(56) References Cited

U.S. PATENT DOCUMENTS

| | | |
|---|---|---|
| 2021/0341124 A1 | 11/2021 | Zhang et al. |
| 2022/0252238 A1 | 8/2022 | Yoshida et al. |
| 2022/0373151 A1 | 11/2022 | Zhang et al. |

FOREIGN PATENT DOCUMENTS

| | | |
|---|---|---|
| JP | 2006-024383 A | 1/2006 |
| JP | 2007-059208 A | 3/2007 |
| JP | 2011-049001 A | 3/2011 |
| JP | 2015-509653 A | 3/2015 |
| JP | 2021-132141 A | 9/2021 |
| JP | 2021-524657 A1 | 9/2021 |
| JP | 2021-525680 A1 | 9/2021 |
| WO | WO-2020/039890 A1 | 2/2020 |
| WO | WO-2021/084919 A1 | 5/2021 |

\* cited by examiner

LIGHT EMITTING MODULE

CROSS-REFERENCE TO RELATED APPLICATIONS

This application is a national stage of PCT Application No. PCT/JP2022/044189, filed on Nov. 30, 2022, which claims priority to Japanese Application No. 2022-011251, filed on Jan. 27, 2022.

BACKGROUND

Technical Field

The present disclosure relates to a light emitting module.

Background Art

Patent Document 1 below discloses a lighting device that includes a plurality of semiconductor light emitting elements, a casing that holds the semiconductor light emitting elements such that the optical axes of the light emitted from the semiconductor light emitting elements are oriented in the same direction, and a casing driving means for changing the position of the casing along a plane that intersects the optical axes. Rotating the casing around the axial center extending in the direction orthogonal to the plane described above at the center of the semiconductor light emitting elements can mix the light emitted from the semiconductor light emitting elements, thereby eliminating nonuniformity in the color temperature and lighting attributable to individual differences of the semiconductor light emitting elements. The light distribution pattern of this lighting device is constant.

CITATION LIST

Patent Literature

Patent Document 1: JP 2005-121872 A

SUMMARY

Technical Problem

An object of the present disclosure is to provide a light emitting module capable of changing the light distribution pattern.

Solution to Problem

A light emitting module according to one embodiment of the present disclosure includes: a substrate; a plurality of light sources fixed on the substrate and generating individually controllable outputs; a light shielding member disposed between the light sources; a first lens disposed above the light sources and on which the light emitted by each of the light sources becomes incident; and a drive unit capable of rotating the substrate. The light sources include a first light source and a second light source. The angle formed by the axis of rotation of the substrate and the optical axis of first light emitted by the first light source and exiting the first lens differs from the angle formed by the axis of rotation and the optical axis of second light emitted by the second light source and exiting the first lens, allowing the second light to irradiate a first circular track having the axis of rotation as its center.

Advantageous Effects of Invention

According to an embodiment of the present disclosure, a light emitting module capable of changing the light distribution pattern can be provided.

DETAILED DESCRIPTION

Figure 1:
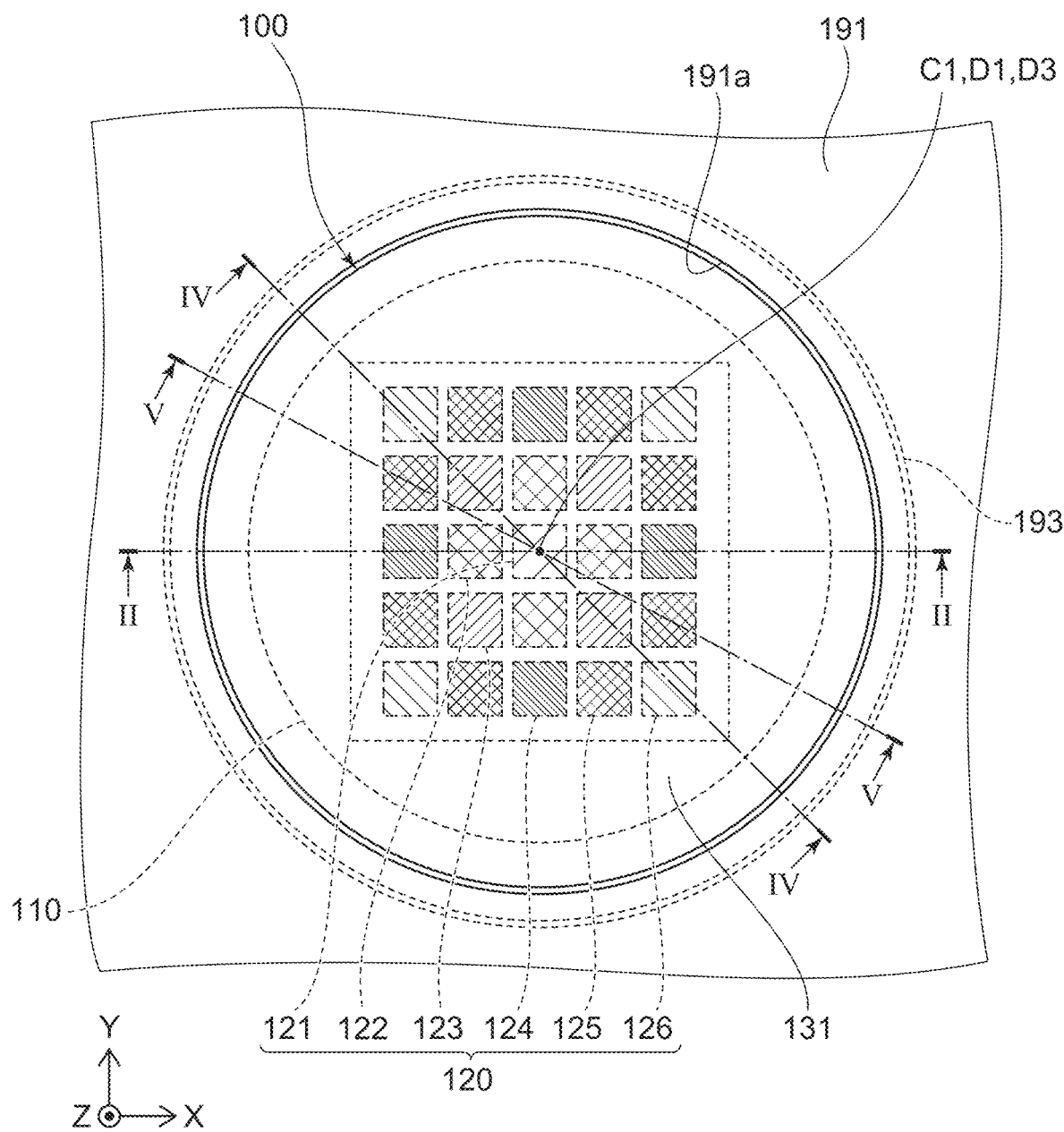
FIG. 1 is a top view of a light emitting module according to a first embodiment.

Certain embodiments of the present disclosure will be explained below with reference to the accompanying drawings.

The drawings are schematic or conceptual. As such, the relationship between the thickness and the width of a portion or part, the dimensional ratio of portions, and the like are not necessarily the same as those in an actual product. Depending on the drawings, the same portion might be depicted with different dimensions or ratio. An end face view only showing a cut section might be used as a cross-sectional view.

In the present specification and the drawings, the same reference numerals denote similar elements that have already been described for which detailed explanation will be omitted as appropriate.

In the present specification, an XYZ orthogonal coordinate system is employed to describe the layout and structure of each part or portion to make the description easily understood. The X, Y, and Z axes are orthogonal to one another. The direction in which the X-axis extends is referred to as "X direction," the direction in which the Y-axis extends is referred to as "Y direction," and the direction in which the Z-axis extends will be referred to as "Z direction." The X direction is an example of a first direction, and the Y direction is an example of a second direction. The X direction in the direction pointed by the arrow will also be referred to as the "+X direction" or the "+X side," and the X direction going against the arrow will be referred to as the "−X direction" or the "−X side." Similarly, the Y direction in the direction pointed by the arrow will also be referred to as the "+Y direction" or the "+Y side," the Y direction going against the arrow will be referred to as the "−Y direction" or the "−Y side," the Z direction in the direction pointed by the arrow will be referred to as the "+Z direction," the "+Z side," or the "upward" direction, and the Z direction going against the arrow will be referred to as the "−Z direction," the "−Z side," or the "downward" direction. These directions are irrespective of the direction of gravity. In the embodiments described below, it is assumed that the light sources of the light emitting modules emit light in the +Z direction as an example. Furthermore, the surface of an object viewed from the +Z side is referred to as the "upper face," and the surface of the object viewed from the −Z side is referred to as the "lower face."

In the present specification or the scope of claims, moreover, when there are multiple pieces of elements having the same designation and a distinction must be made, a word such as "first," "second," or the like might occasionally be added to the element designation. There can be an occasion where a subject distinguished by such a word might differ between that in the present specification and that in the scope of claims. For this reason, even if a constituent designation with the same distinguishing word appear in both the scope of claims and the specification, the subject identified by the word in the scope of claims might not match the subject identified by the word in the specification.

For example, when there are constituent elements distinguished by the words "first," "second," and "third" in the present specification, in disclosing the "first" and "third" elements described in the specification in the scope of claims, the elements might be distinguished by using the words "first" and "second" in the scope of claims from the readability standpoint. In this case, the "first" and "second" elements disclosed in the scope of claims would refer to the "first" and "third" elements described in the present specification. This rule will be reasonably and flexibly applied to not only constituent elements, but also other subjects.

First Embodiment

A first embodiment of the present invention will be explained.

Figure 2:
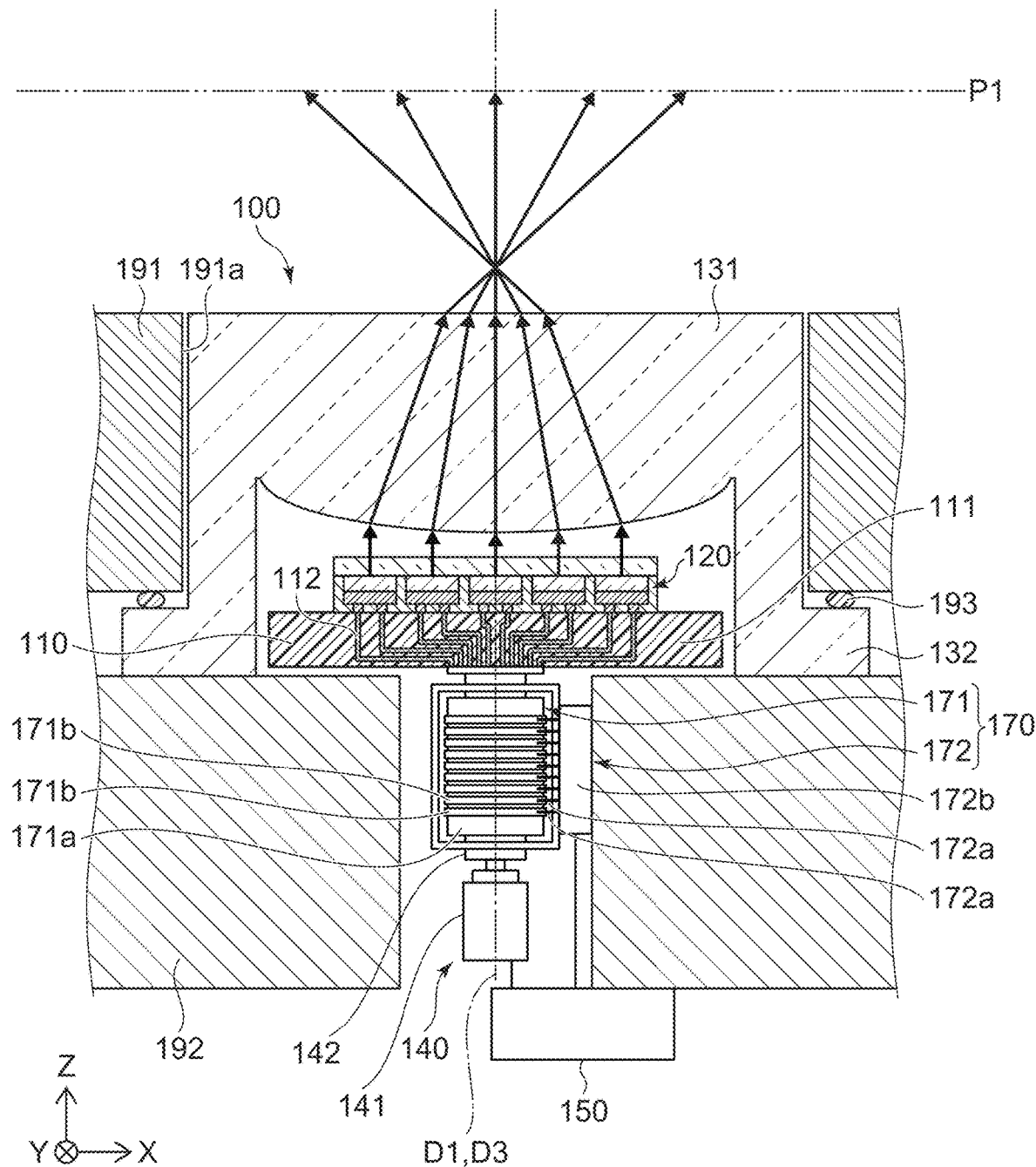
FIG. 2 is a partial cross-sectional view taken along line II-II in FIG. 1.
Figure 3:
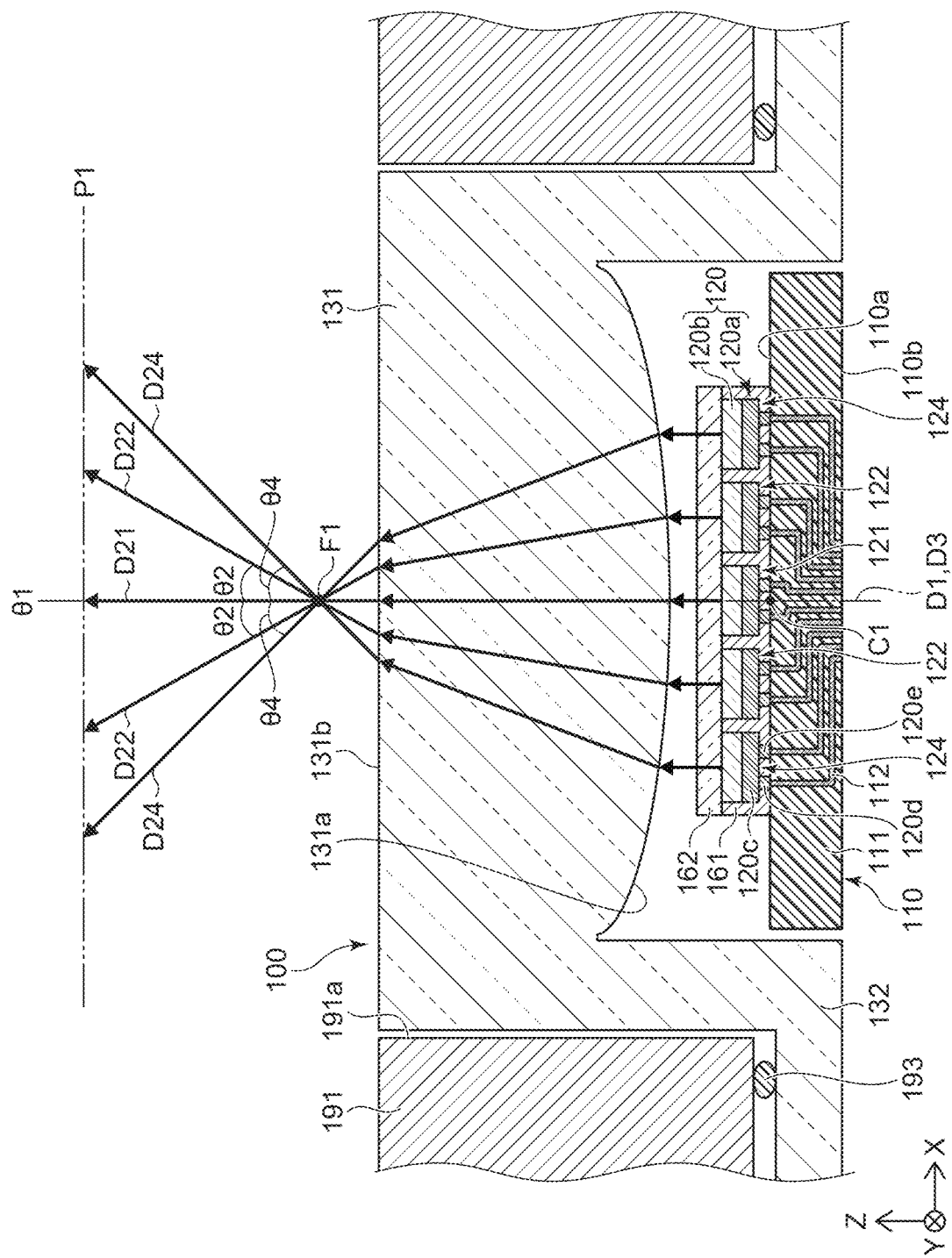
FIG. 3 is a cross-sectional view enlarging a portion of the cross section shown in FIG. 2.
Figure 4:
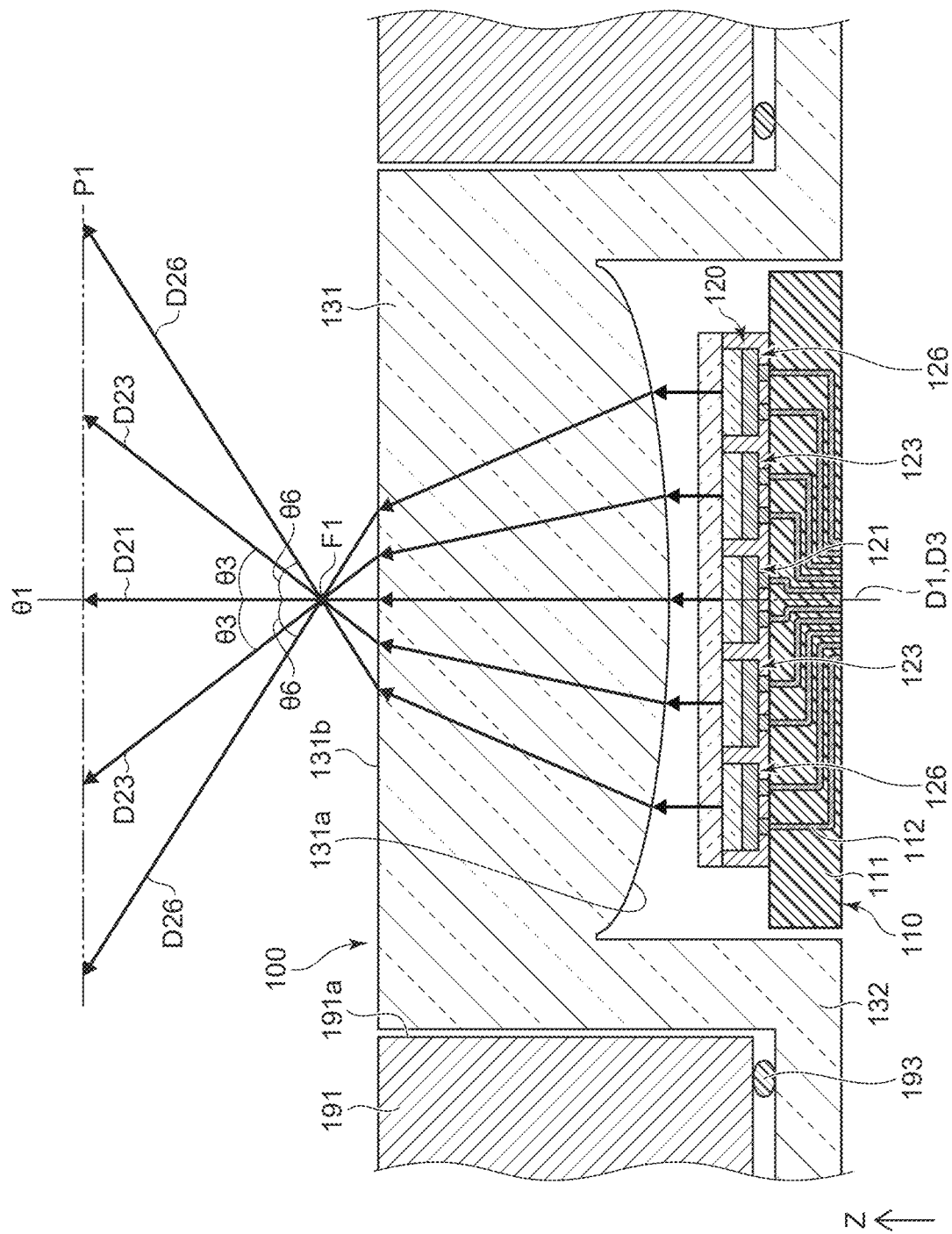
FIG. 4 is a cross-sectional view showing a portion of the cross section taken along line IV-IV in FIG. 1.
Figure 5:
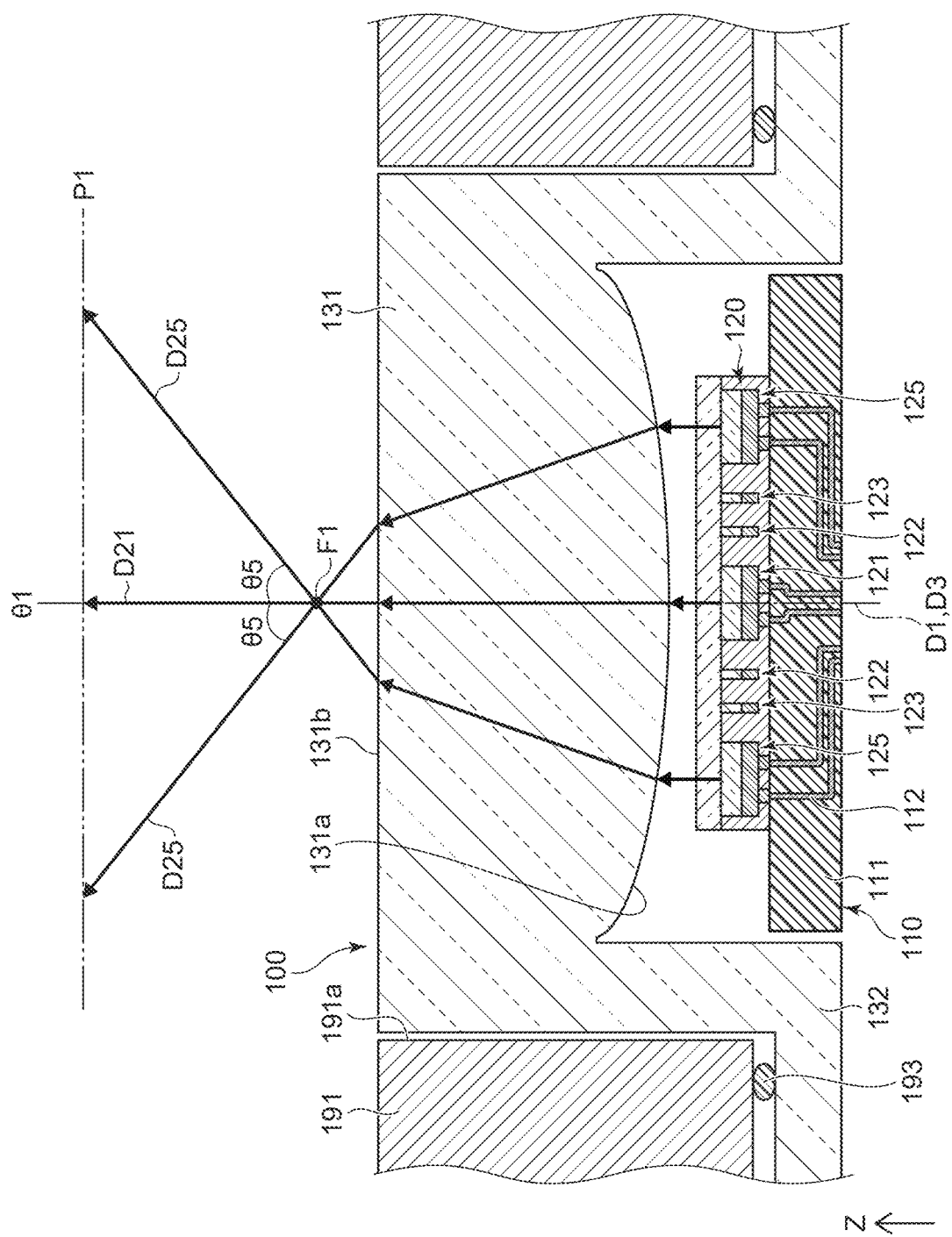
FIG. 5 is a cross-sectional view of a portion of the cross section taken along line V-V in FIG. 1.
Figure 6A:
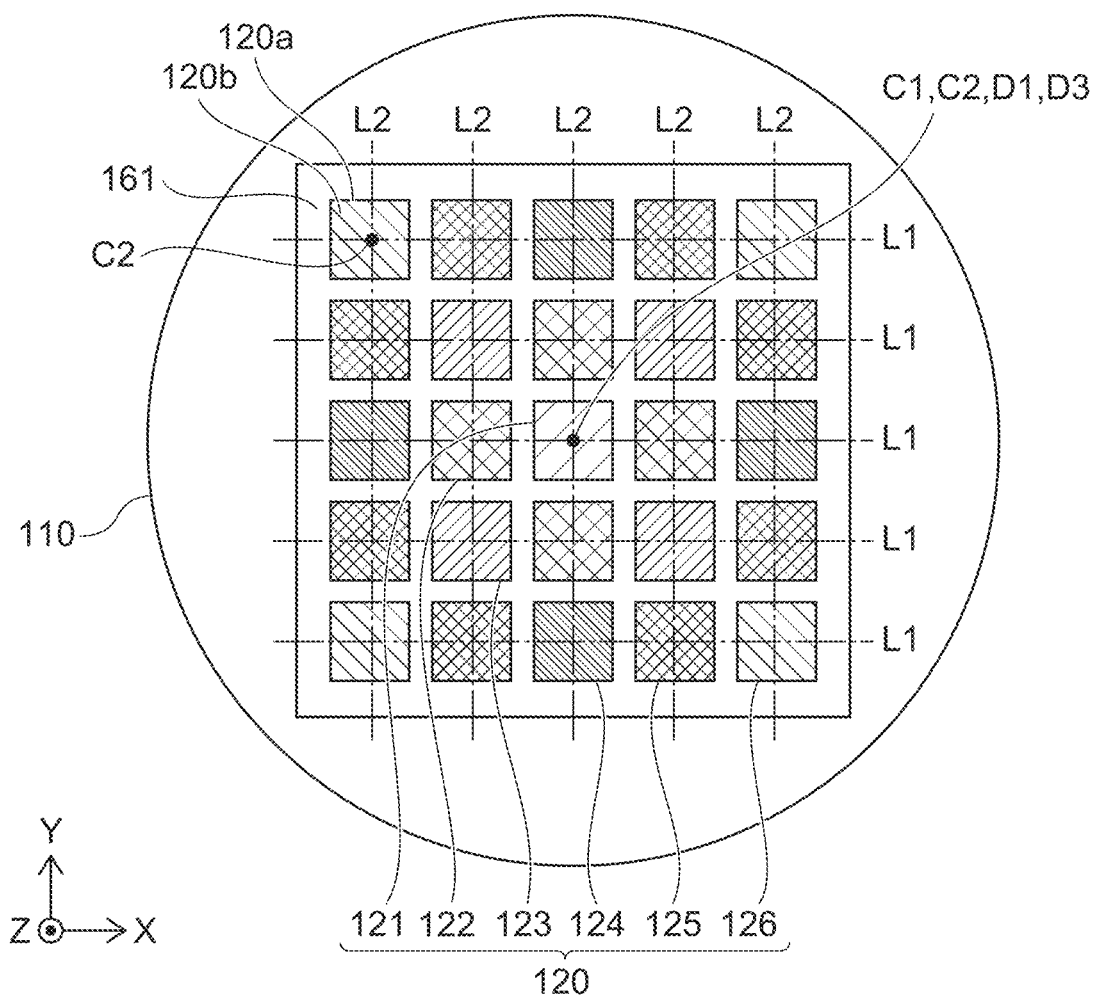
FIG. 6A is a top view of the substrate, the light sources, and the light shielding member shown in FIG. 1.
Figure 6B:
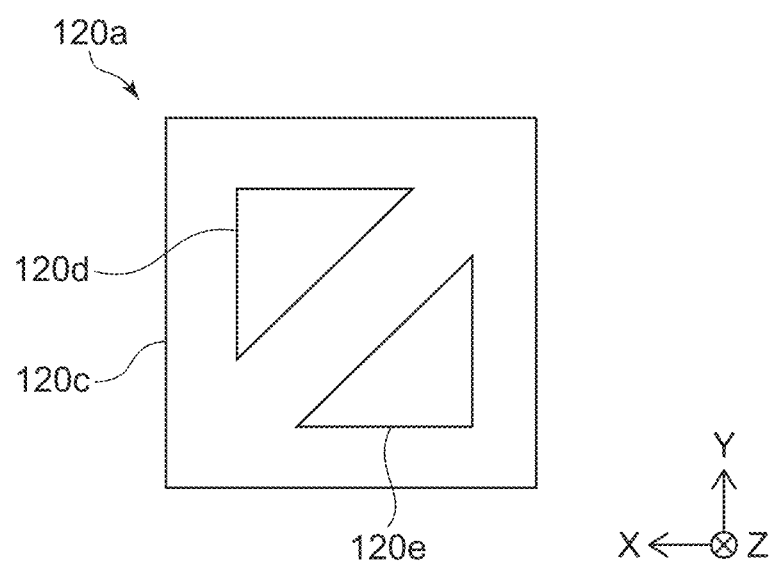
FIG. 6B is a bottom view enlarging one of the light sources in FIG. 6A.
Figure 7:
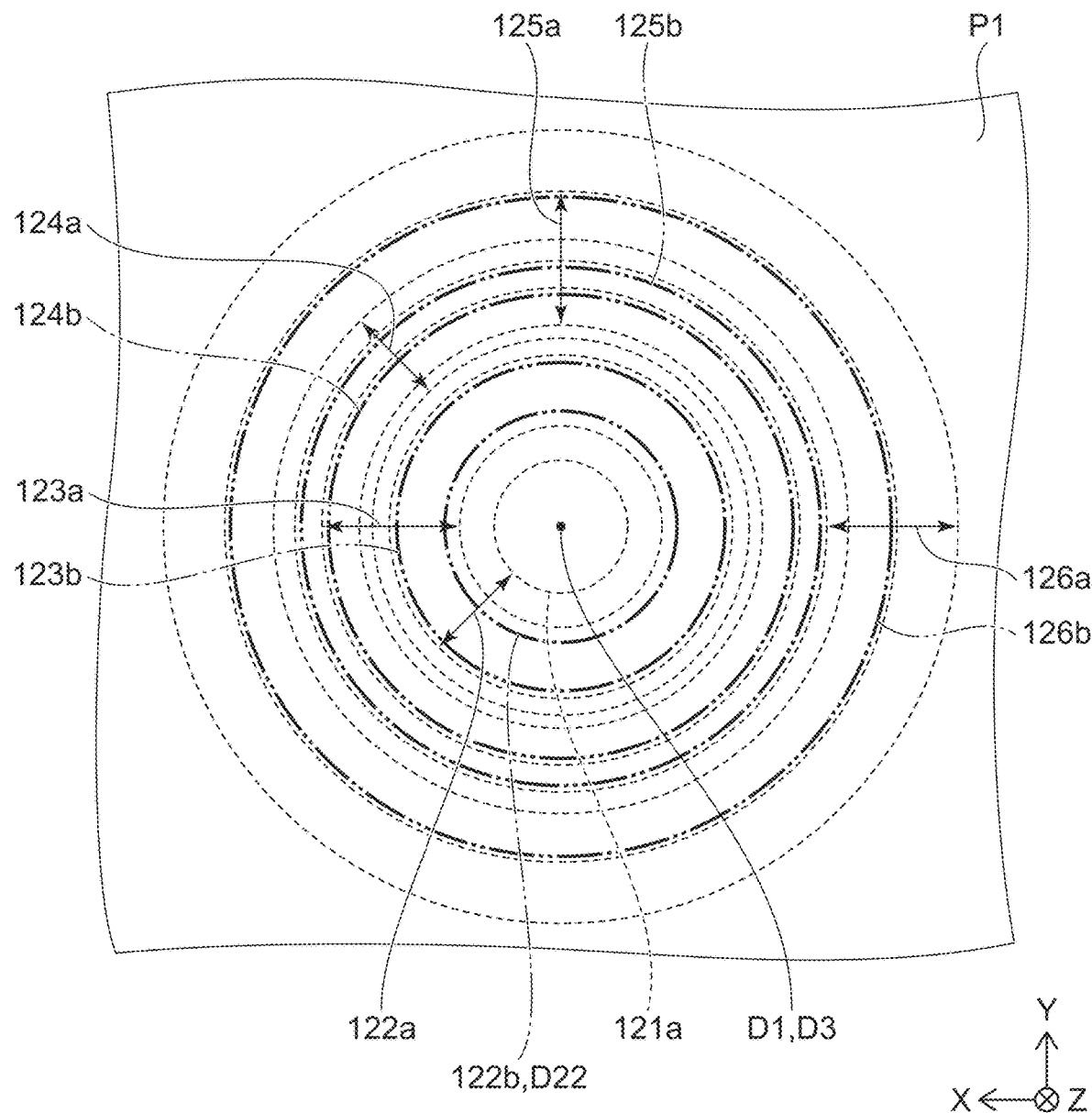
FIG. 7 is a schematic diagram of an irradiated plane showing the irradiating regions of the light emitted by the light sources and exiting the lens.

FIG. 1 is a top view of a light emitting module according to this embodiment. FIG. 2 is a partial cross-sectional view taken along line II-II in FIG. 1. FIG. 3 is a cross-sectional view enlarging a portion of the cross section shown in FIG. 2. FIG. 4 is a cross-sectional view taken along line IV-IV in FIG. 1. FIG. 5 is a cross-sectional view taken along line V-V in FIG. 1. FIG. 6A is a top view of the substrate, the light sources, and the light shielding member shown in FIG. 1. FIG. 6B is a bottom view enlarging one of the light sources in FIG. 6A. FIG. 7 is a schematic diagram of an irradiated plane showing the irradiating regions of the light emitted by the light sources and exiting the first lens.

In FIG. 2 to FIG. 5, a portion of the light emitted by each light source 120 is indicated by an arrow. The same applies to the other drawings described later.

A light emitting module 100, as shown in FIG. 2, includes a substrate 110, a plurality of light sources 120, a first lens 131, and a drive unit 140. An example of the use of the light emitting module 100 as a light source of a flashlight of a camera installed in a casing 191 of a smartphone will be described below. The use of the light emitting module 100, however, is not limited to that described above. Each part of the light emitting module 100 will be described in detail below.

The substrate 110 in this embodiment, as shown in FIG. 3, is a wiring board having a resin layer 111 and wires 112. The wires 112 are provided in the substrate 110.

The surfaces of the substrate 110 include an upper face 110a and a lower face 110b positioned opposite the upper face 110a. The upper face 110a and the lower face 110b are substantially flat and substantially parallel to the X-Y plane. As shown in FIG. 1, the top view shape of the substrate 110 is substantially circular. However, the shape of the substrate 110 is not limited to that described above.

As shown in FIG. 3, the light sources 120 are fixed on the substrate 110, i.e., on the upper face 110a of the substrate 110. Each light source 120 has a light emitting element 120a and a wavelength conversion member 120b.

A light emitting element 120a is, for example, an LED (light emitting diode). The light emitting element 120a includes a semiconductor stack structure 120c and a pair of positive and negative electrodes 120d and 120e disposed on the lower face of the semiconductor stack structure 120c. The light emitting element 120a may further include a light transmissive substrate or the like disposed on the semiconductor stack structure 120c.

The semiconductor stack structure 120c includes an n-type semiconductor layer, an active layer, and a p-type semiconductor layer. As shown in FIG. 6B, the bottom view shape of the semiconductor stack structure 120c is quadrangular, in which two opposing sides of the four sides are substantially parallel to the X direction and the remaining two opposing sides are substantially parallel to the Y direction. A light emitting element 120a (i.e., a light source 120) has, for example, a quadrangular shape in a top view, each side being 50 μm to 1000 μm in length. The shape of the semiconductor stack structure 120c, however, is not limited to this.

For the materials for the semiconductor stack structure 120c, a nitride semiconductor capable of emitting short-wavelength light is preferably used. This allows for efficient excitation of the wavelength conversion substance contained in the wavelength conversion member 120b. A nitride semiconductor is primarily expressed by the general formula $In_xAl_yGa_{1-x-y}N$ ($0 \leq x$, $0 \leq y$, $x+y \leq 1$). The peak wavelength of the light emitted by the semiconductor stack structure 120c is preferably in a range of 400 nm to 530 nm, more preferably 420 nm to 490 nm, even more preferably 450 nm to 475 nm from the standpoint of emission efficiency, excitation of a wavelength conversion substance, and color mixing with the light emitted by the wavelength conversion substance. For the materials for the semiconductor stack structure 120c, however, InAlGaAs based semiconductors, InAlGaP based semiconductors, or the like may be used. The color of the light emitted from the semiconductor stack structure 120c in this embodiment is blue.

One of the pair of electrodes 120d and 120e is electrically connected to the n-type semiconductor layer of the semiconductor stack structure 120c and the other is electrically connected to the p-type semiconductor layer of the semiconductor stack structure 120c. The electrodes 120d and 120e of the light sources 120 are electrically connected to the wires 112 of the substrate 110 in pairs. Accordingly, the outputs of the light sources 120 are individually controllable.

As the size of a light source 120 decreases, securing the bottom view areas of the electrodes 120d and 120e becomes more difficult while keeping the pair of electrodes 120d and 120e apart from one another. In contrast, in this embodiment, as shown in FIG. 6B, the pair of electrodes 120d and 120e have right triangle shapes in the bottom view and are arranged in a diagonal direction of the semiconductor stack structure 120c such that the right angles of the right triangles oppose two corners of the semiconductor stack structure 120c. This can increase the area of each of the pair of electrodes 120d and 120e in the bottom view while positioning the electrodes adequately apart from one another as compared to the case of a pair of substantially rectangular electrodes whose sides are extending in the X or Y direction, for example. However, the shape of each of the pair of electrodes 120d and 120e, and the direction of their arrangement are not limited to those described above. For example, in order to easily differentiate the electrode electrically connected to the p-type semiconductor layer from the electrode electrically connected to the n-type semiconductor layer, the pair of electrodes may have different shapes. Moreover, the pair of electrodes may be arranged along the X or Y direction, and the shape of each electrode may be circular, elliptical, or polygonal such as a quadrangle.

As shown in FIG. 3, a wavelength conversion member 120b is disposed on a light emitting element 120a. The wavelength conversion member 120b includes a light transmissive resin material as the base material and a wavelength conversion substance. The wavelength conversion member 120b may be a sintered body of a wavelength conversion substance.

For the base material of the wavelength conversion members 120b, for example, a resin material having light transmissivity such as silicone can be used. The wavelength conversion substance absorbs at least a portion of the primary light emitted by the light emitting elements 120a and emits secondary light having a different wavelength from that of the primary light. For the wavelength conversion substance, for example, yttrium aluminum garnet based phosphors (e.g., $Y_3(Al,Ga)_5O_{12}$:Ce), lutetium aluminum garnet based phosphors (e.g., $Lu_3(Al,Ga)_5O_{12}$:Ce), terbium aluminum garnet based phosphors (e.g., $Tb_3(Al,Ga)_5O_{12}$:Ce), CCA-based phosphors (e.g., $Ca_{10}(PO_4)_6Cl_2$:Eu), SAE based phosphors (e.g., $Sr_4Al_{14}O_{25}$:Eu), chlorosilicate based phosphors (e.g., $Ca_8MgSi_4O_{16}Cl_2$:Eu), oxynitride based phosphors, such as β-SiAlON phosphors (e.g., $(Si,Al)_3(O,N)_4$:Eu) or α-SiAlON phosphors (e.g., $Ca(Si,Al)_{12}(O,N)_{16}$:Eu), SLA based phosphors (e.g., $SrLiAl_3N_4$:Eu), nitride based phosphors, such as CASN-based phosphors (e.g., $CaAlSiN_3$:Eu) or SCASN-based phosphors (e.g., $(Sr,Ca)AlSiN_3$:Eu), fluoride based phosphors, such as KSF-based phosphors (e.g., $K_2SiF_6$:Mn), KSAF-based phosphors (e.g., $K_2Si_{0.99}Al_{0.01}F_{5.99}$:Mn), or MGF-based phosphors (e.g., $3.5MgO \cdot 0.5MgF_2 \cdot GeO_2$:Mn), phosphors having a Perovskite structure (e.g., $(CsPb(F,Cl,Br,I)_3)$, quantum dot phosphors (e.g., CdSe, InP, $AgInS_2$ or $AgInSe_2$), or the like can be used.

KSAF-based phosphors may have a composition represented by the formula (I) below:

$$M_2[Si_pAl_qMn_rF_s] \quad (I)$$

In the formula (I), M represents an alkali metal, and may include at least K. Mn can be tetravalent Mn ions. P, q, r, and s can satisfy $0.9 \leq p+q+r \leq 1.1$, $0 < q \leq 0.1$, $0 < r \leq 0.2$, and $5.9 \leq s \leq 6.1$, preferably, $0.95 \leq p+q+r \leq 1.05$ or $0.97 \leq p+q+r \leq 1.03$, $0 < q \leq 0.03$, $0.002 \leq q \leq 0.02$ or $0.003 \leq q \leq 0.015$, $0.005 \leq r \leq 0.15$, $0.01 \leq r \leq 0.12$ or $0.015 \leq r \leq 0.1$, $5.92 \leq s \leq 6.05$ or $5.95 \leq s \leq 6.025$. Examples of such a composition include the compositions represented by $K_2[Si_{0.946}Al_{0.005}Mn_{0.049}F_{5.995}]$, $K_2[Si_{0.942}Al_{0.008}Mn_{0.050}F_{5.992}]$ and $K_2[Si_{0.939}Al_{0.014}Mn_{0.047}F_{5.986}]$. Such KSAF-based phosphors can emit high luminance red light having a peak emission wavelength with a narrow full width at half maximum.

The color of the light emitted by the wavelength conversion member 120b is yellow, for example. Each light source 120 emits white light as a result of combining the blue light emitted by the light emitting element 120a and the yellow light emitted by the wavelength conversion member 120b. The color of light emitted by each light source, however, is not limited to white.

The light sources 120 are provided at the intersections of a plurality of first straight lines L1 extending in the X direction (i.e., the first direction) and arranged in the Y direction (i.e., the second direction) that is orthogonal to the X direction and a plurality of second straight lines L2 extending in the Y direction and arranged in the X direction. Specifically, as shown in FIG. 6A, the first straight lines L1 are arranged in the Y direction at equal intervals. The second straight lines L2 are arranged in the X direction at equal intervals. In this embodiment, the light sources 120 are arranged at the 25 intersections of five first straight lines L1 and five second straight lines L2. In other words, 25 light sources 120 are provided in the light emitting module 100. The center C2 of each light source 120 in the top view is substantially positioned at an intersection. The center C2 of the light source 120 located at the center among the 25 light sources 120 is positioned at the center C1 of the substrate 110 in the top view. As described above, the light sources 120 are arranged in a matrix. The distance between the centers C2 of the adjacent light sources 120 in the X or Y direction in the top view is, for example, 50 μm to 1000 μm. The distance between the adjacent light sources 120 in the X or Y direction is, for example, 10 µm to 500 µm. The number and positions of the light sources in the light emitting module are not limited to those described above. For example, a light source 120 does not have to be disposed at the center C1 of the substrate 110.

As shown in FIG. 3, the light emitting module 100 according to this embodiment may further include a light shielding member 161 and a light transmissive member 162 that cover the light sources 120.

The light shielding member 161 in this embodiment, as shown in FIG. 6A, surrounds the light sources 120 and is disposed between the light sources 120. The light sources 120 are integrated by the light shielding member 161. The light shielding member 161 includes, for example, a resin material and a light diffusing material, where the light diffusing material diffuses and reflects the light emitted by the light emitting elements 120a and the wavelength conversion member 120b. This can reduce the light that exits the lateral faces of the light emitting elements 120a without propagating through the wavelength conversion member 120b. As a result, the color nonuniformity of the light emitted from the light sources 120 can be reduced. For the resin material included in the light shielding member 161, a silicone, epoxy, phenol, polycarbonate, or acrylic resin, or their modified resins, or the like can be used. For the light diffusing material contained in the light shielding member 161, titanium oxide, magnesium oxide, or the like can be used.

The light transmissive member 162 is disposed over and across all of the light sources 120 as shown in FIG. 3, for example. The light transmissive member 162 can diffuse the light emitted by the light sources 120. This can make less conspicuous the spaces between the light emitted from adjacent light sources 120 to appear as dark spots. The thickness of the light transmissive member 162 is substantially constant. The light transmissive member 162 is in contact with the upper faces of the light sources 120 and the upper face of the light shielding member 161. The light transmissive member may be apart from the light sources and the light shielding member. Multiple light transmissive members may be disposed to individually correspond to the light sources 120. In this case, the light shielding member may be disposed between two adjacent light transmissive members. For the light transmissive member 162, a resin material, glass, or the like having light transmissivity can be used. The light transmissive member 162 may contain a light diffusing material. For the light diffusing material in the light transmissive member 162, for example, titanium oxide, magnesium oxide, or the like can be used.

The light emitted from each light source 120 becomes incident on the first lens 131. The first lens 131 is disposed above and apart from the light transmissive member 162. The shortest distance between the first lens 131 and the light transmissive member 162 is, for example, 50 µm to 1000 µm. The first lens 131 is a solid of revolution formed around the axis D1 that passes the center C1 of the substrate 110 in a top view and extends in the Z direction. Here, a "solid of revolution" means a three-dimensional object formed by rotating a plane around a straight line as an axis while accepting a tolerance in the manufacturing accuracy of the first lens 131. Accordingly, the axis D1 constitutes the optical axis of the first lens 131.

The first lens 131 in this embodiment is a lens having a convex surface protruding towards the light sources 120. The surfaces of the first lens 131 include a light incident face 131a opposing the light sources 120 and an light emission face 131b positioned opposite the light incident face 131a.

The light incident face 131a is a convex face. The light emission face 131b is flat and substantially parallel to the X-Y plane.

In FIG. 1 and FIG. 6A, to make the explanation easily understood, the light sources 120 whose centers C2 are equally distanced from the axis D1 are indicated by the same hatch or shading patterns. The 25 light sources 120 will be referred to as "first light sources 121," "second light sources 122," "third light sources 123," "fourth light sources 124," "fifth light sources 125," and "sixth light sources 126" grouped in the ascending order in terms of the distances from the axis D1 to the centers C2. There is one first light source 121. There are four second light sources 122, four third light sources 123, four fourth light sources 124, light fifth light sources 125, and four sixth light sources 126.

As shown in FIG. 3 to FIG. 5, the optical axes D21, D22, D23, D24, D25, and D26 of the light emitted by each light source 121, 122, 123, 124, 125, and 126 that exits the first lens 131 pass through the focal point F1 of the first lens 131 in this embodiment. The optical axes D22, D23, D24, D25, and D26 of the light emitted by the light sources 122, 123, 124, 125, and 126 (excluding the first light source 121) and exiting the first lens 131 become more distant from the axis D1 in the +Z direction after passing through the focal point F1.

Specifically, as shown in FIG. 3, the angle $\theta 1$ formed by the axis D1 and the optical axis D21 of the light emitted by the first light source 121 and exiting the first lens 131 is substantially 0 degrees.

The angle $\theta 2$ formed by the axis D1 and the optical axis D22 of the light emitted by any second light source 122 and exiting the first lens 131 is substantially the same because the first lens 131 is a solid of revolution formed around the axis D1 as a central axis. The angle $\theta 2$ differs from and is greater than the angle $\theta 1$.

As shown in FIG. 4, the angle $\theta 3$ formed by the axis D1 and the optical axis D23 of the light emitted by any third light source 123 and exiting the first lens 131 is substantially the same because the first lens 131 is a solid of revolution formed around the axis D1 as the central axis. The angle $\theta 3$ is greater than the angle $\theta 2$.

As shown in FIG. 3, the angle $\theta 4$ formed by the axis D1 and the optical axis D24 of the light emitted by any fourth light source 124 and exiting the first lens 131 is substantially the same because the first lens 131 is a solid of revolution formed around the axis D1 as the central axis. The angle $\theta 4$ is greater than the angle $\theta 3$.

As shown in FIG. 5, the angle $\theta 5$ formed by the axis D1 and the optical axis D25 of the light emitted by any fifth light source 125 and exiting the first lens 131 is substantially the same because the first lens 131 is a solid of revolution formed around the axis D1 as the central axis. The angle $\theta 5$ is greater than the angle $\theta 4$.

As shown in FIG. 4, the angle $\theta 6$ formed by the axis D1 and the optical axis D26 of the light emitted by any sixth light source 126 and exiting the first lens 131 is substantially the same because the first lens 131 is a solid of revolution formed around the axis D1 as the central axis. The angle $\theta 6$ is greater than the angle $\theta 5$.

The magnitude of each of the angles $\theta 2$, $\theta 3$, $\theta 4$, $\theta 5$, and $\theta 6$ can be adjusted by way of adjusting, for example, the curvature of the light incident face 131a or the distance of each light source 120 from the axis D1.

In the peripheral portion of the first lens 131, a support portion 132 that extends downwards from the peripheral portion of the first lens 131 is provided. The support portion 132 is integrally formed with the first lens 131. The support portion 132 in this embodiment has a tubular shape that surrounds the light sources 120 in a top view. However, the shape of the support portion is not limited to a tubular shape. For example, multiple columnar supports may be arranged in the peripheral portion of the lens. Furthermore, the support portion may be composed of a different material from that for the lens. In this case, the support portion does not have to have light transmissivity.

As shown in FIG. 2, an opening 191a is provided in the casing 191 of a smartphone. The first lens 131 in this embodiment is disposed in the opening 191a. The support portion 132 is fixed to a constituent element 192 of the smartphone provided in the casing 191 of the smartphone. Between the support portion 132 and the casing 191, a sealing member 193 adhering to the support portion 132 and the casing 191 is provided. For the sealing member 191, for example, an elastic material, such as natural rubber or synthetic rubber, can be used. The shape of the sealing member 193, as shown in FIG. 1, is annular. The sealing member 193 can reduce the penetration of dust or liquid through the gap between the first lens 131 and the casing 191. The position of the sealing member, however, is not limited to that described above as long as it can reduce the penetration of dust or liquid through the gap between the lens and the casing. For example, the sealing member may be disposed in the gap between the main body of the lens and the casing. Furthermore, the lens itself may be fixed to the casing without any support portion.

The drive unit 140 in this embodiment has a motor 141 and a shaft 142 that is connected to the substrate 110 and in coordination with the motor 141. Driving the motor 141 rotates the shaft 142. As the shaft 142 rotates, the substrate 110 rotates about the axis of rotation D3 which parallels the Z axis. The axis of rotation D3 in this embodiment substantially coincides with the axis D1.

The light emitting module 100 further includes a control unit 150 capable of controlling the outputs of the light sources 120 in coordination with the drive unit 140. The shaft 142 is provided with a rotary connector 170. The rotary connector 170 has a ring unit 171 and a brush unit 172. The rotary connector 170 electrically connects the wires 112 of the rotating substrate 110 and the control unit 150. The rotary connector 170 in this embodiment is a slip ring. The rotary connector, however, may be a rotary connector which uses a liquid metal.

The ring unit 171 has a tubular body 171a housing and connected to the shaft 142, and conducting rings 171b disposed on the periphery of the tubular body 171a. The ring unit 171 rotates with the shaft 142. A plurality of rings 171b and a plurality of wires 112 built into the substrate 110 are electrically connected in pairs via the interior of the shaft 142 and the interior of the tubular body 171a.

The brush unit 172 has a plurality of conducting brushes 172a contacting the rings 171b in pairs, and a holder 172b that holds the brushes 172a.

The control unit 150 has, for example, a CPU (central processing unit) and a memory. The control unit 150 is electrically connected to the motor 141 of the drive unit 140 and each brush 172a of the rotary connector 170.

The control unit 150 and the brush unit 172 in this embodiment are fixed to the constituent element 192 of the smartphone. Accordingly, when the motor 141 is operated, an electrical signal can be sent to the ring unit 171 without rotating the control unit 150 and the brush unit 172.

The operation of the light emitting module 100 according to this embodiment will be described next.

The control unit 150 controls the drive unit 140 to rotate the substrate 110. The rotational speed of the substrate 110 is not particularly limited, but is in a range of 60 rpm to 24000 rpm, for example. The control unit 150 can be adapted to adjust the rotational speed of the motor 141 of the drive unit 140.

As shown in FIG. 3, the angle $\theta 1$ formed by the axis of rotation D3 and the optical axis D21 of the light emitted by the first light source 121 and exiting the first lens 131 is substantially 0 degrees. Accordingly, when the first light source 121 is lit during a rotation of the substrate 110, the majority of the light emitted by the first light source 121 and exiting the first lend 131 rotates around the axis of rotation D3 in the irradiated plane P1 that is orthogonal to the axis of rotation D3 and located in the +Z direction of the first lens 131. In this embodiment, the irradiated plane P1 is an imaginary plane. The irradiating region of the light emitted by the first light source 121 and exiting the first lens 131 in the irradiated plane P1 when the first light source 121 is lit during a rotation of the substrate 110 will be referred to as an "irradiating region 121a" below. As shown in FIG. 7, the irradiating region 121a is substantially a circular region having the axis of rotation D3 as its center.

As shown in FIG. 3, the angle $\theta 2$ formed by the axis of rotation D3 and the optical axis D22 of the light emitted by each second light source 122 and exiting the first lens 131 is different from $\theta 1$ and is greater than zero degrees. When a second light source 122 is lit during a rotation of the substrate 110, the light emitted by the second light source 122 and exiting the first lens 131 rotates around the axis of rotation D3 in the irradiated plane P1 in the state in which the optical axis D22 is oblique to the axis of rotation D3. The irradiating region of the light emitted by the second light source 122 and exiting the first lens 131 in the irradiated plane P1 when the second light source 122 is lit during a rotation of the substrate 110 will be referred to as an "irradiating region 122a" below. As shown in FIG. 7, the irradiating region 122a is an annular region located on the outward of the irradiating region 121a. A portion of the irradiating region 122a may overlap the irradiating region 121a. As the substrate 110 rotates, the optical axis D22 moves on a first circular track 122b in the irradiating region 122a. The first circular track 122b when viewed in the Z direction (from the −Z side in FIG. 3) is a track having the axis of rotation D3 as its center.

As shown in FIG. 3 and FIG. 4, the angle $\theta 3$ formed by the axis of rotation D3 and the optical axis D23 of the light emitted by a third light source 123 and exiting the first lens 131 is different from the angle $\theta 1$ and $\theta 2$, and is greater than $\theta 2$. When a third light source 123 is lit during a rotation of the substrate 110, the light emitted by the third light source 123 and exiting the first lens 131 rotates around the axis of rotation D3 in the irradiated plane P1 in the state in which the optical axis D23 is positioned more distant from the axis of rotation D3 than the optical axis D22 is. The irradiating region of the light emitted by the third light source 123 and exiting the first lens 131 in the irradiated plane P1 when the third light source 123 is lit during a rotation of the substrate 110 will be referred to as an "irradiating region 123a" below. As shown in FIG. 7, the irradiating region 123a is an annular region in which a portion thereof overlaps the irradiating region 122a and the other portion positioned on the outward of the irradiating region 122a. As the substrate 110 rotates, the optical axis D23 moves on a second circular track 123b in the irradiating region 123a. The second circular track 123b when viewed in the Z direction (from the −Z direction in FIG. 3) is a track having the axis of rotation D3 as its center.

Similar to the third light source 123, when each of the light sources 124, 125, and 126 is lit during a rotation of the substrate 110, as shown in FIG. 3, FIG. 4, and FIG. 5, the light emitted by each light source 124, 125, and 126 and exiting the first lens 131 rotates around the axis of rotation D3 in the irradiated plane P1 in the state in which each optical axe D24, D25, and D26 is oblique to the axis of rotation D3. The larger the distance between the center C2 of a light source 120 and the axis of rotation D3, the larger the angle formed by the axis of rotation D3 and the optical axis of the light emitted by the light source 120 and exiting the first lens 131 results. Thus, the angle θ3<the angle θ4<the angle θ5<the angle θ6. The irradiating regions of the light emitted respectively by the light sources 124, 125, and 126 and exiting the first lens 131 in the irradiated plane P1 when the light sources 124, 125, and 126 are respectively lit during a rotation of the substrate 110 will be referred to as an "irradiating region 124a," "irradiating region 125a," and "irradiating region 126a" below.

As shown in FIG. 7, the irradiating region 124a is an annular region in which a portion overlaps the irradiating region 123a and the other portion is located on the outward of the irradiating region 123a. As the substrate 110 rotates, the optical axis D24 moves on a third circular track 124b in the irradiating region 124a. The irradiating region 125a is an annular region in which a portion overlaps the irradiating region 124a and the other portion is located on the outward of the irradiating region 124a. As the substrate 110 rotates, the optical axis D25 moves on a fourth circular track 125b in the irradiating region 125a. The irradiating region 126a is an annular region in which a portion overlaps the irradiating region 125a and the other portion is located on the outward of the irradiating region 125a. As the substrate 110 rotates, the optical axis D26 moves on a fifth circular track 126b in the irradiating region 126a. The third circular track 124b, the furth circular track 125b, and the fifth circular track 126b when viewed in the Z direction (from the −Z side in FIG. 3) are tracks having the axis of rotation D3 as their center.

The optical axes D22, D23, D24, D25, and D26 of the light emitted by the light sources 122, 123, 124, 125, and 126, excluding the first light source 121, and exiting the first lens 131 become more distant from the axis D1 in the +Z direction after passing the focal point F1. Accordingly, the light emitting module 100 can irradiate a broader area of the irradiated plane P1 while being reduced in the module size.

In this embodiment, the radii of the circular tracks 122b, 123b, 124b, 125b, and 126b respectively correspond to the distances from the respective centers C2 of the light sources 122, 123, 124, 125, and 126 to the axis of rotation D3. In this embodiment, because the light sources 120 are arranged in a matrix, and the centers C of the light sources 120 are not positioned on equally spaced circumferences around the axis of rotation D3, the spacing of adjacent circular tracks is not uniform. However, even when the light sources 120 are arranged in a matrix, the circular tracks 122b, 123b, 124b, 125b, and 126b can be arranged at substantially equal intervals by adjusting the shape of the first lens 131.

In this embodiment, moreover, adjacent irradiating regions among the irradiating regions 122a, 123a, 124a, 125a, and 126a partly overlap each other. Allowing adjacent regions to have overlapping portions can reduce the occurrence of a low brightness region between adjacent circular tracks. However, depending on the application of the light emitting module 100, the irradiating regions may be set such that no two adjacent regions overlap each other. In this embodiment, furthermore, the irradiating region 121a is solid circular, the irradiating regions 122a, 123a, 124a, 125a, and 126a are annular, and the circular tracks 122b, 123b, 124b, 125b, and 126b are annular. However, the irradiating regions do not have to be strictly circular or annular depending on the manufacturing accuracy of each part or assembly accuracy of parts. The circular tracks do not have to be strictly circular depending on the manufacturing accuracy of each part or assembly accuracy of parts.

For example, when there are multiple subjects in a photographing region of a camera at different distances from the light emitting module 100, and light of substantially uniform luminous intensity irradiates the entire photographing region, the brightness of the subject declines as the distance of the subject from the light emitting module 100 increases. For this reason, when the camera captures an image of multiple subjects, a nearby subject might be clipped to appear white and a distant subject might be clipped to appear black in the captured image. In contrast, the control unit 150 in this embodiment individually controls the outputs of the light sources 120 while the substrate 110 rotates.

Specifically, the control unit 150 controls the output of the first light source 121 such that the brightness of the irradiating region 121a achieves predetermined brightness. This, for example, can achieve the brightness of the irradiating region 121a in accordance with the distance of a subject located in the irradiating region 121a viewed in the Z direction. At this time, the control unit 150 may be adapted to set the output of the light source 121 by further incorporating a condition into the drive conditions of the light emitting module 100 such as the rotational speed or the number of rotation of the substrate 110 and/or the shooting conditions such as the shutter speed of the camera.

Moreover, the control unit 150 controls the outputs of the light sources excluding the first light source 121, i.e., the light sources 122, 123, 124, 125, and 126, in coordination with the rotation of the substrate 110. Specifically, for example, the control unit 150 controls the outputs of the light sources 122, 123, 124, 125, and 126 in accordance with the positions of the optical axes D22, D23, D24, D25, and D26 on the respective circular tracks 122b, 123b, 124b, 125b, and 126b. This, for example, can make the circumferential brightness distribution of the irradiating region 122a in accordance with the distance in the Z direction to each subject located in the irradiating region 122a. This similarly applies to the other irradiating regions 123a, 124a, 125a, and 126a. At this time, the control unit 150 may be adapted to set the outputs of the light sources 122, 123, 124, 125, and 126 by further incorporating a condition into the drive conditions of the light emitting module 100, such as the rotational speed or the number of rotation of the substrate 110, and/or the shooting conditions such as the shutter speed of the camera. The angle θ1 formed by the axis of rotation D3 and the optical axis D21 of the light emitted by the first light source 121 and exiting the first lens 131 may be larger than 0 degrees. In other words, the optical axis D21 of the first light source 121 may move on a circular track having the axis of rotation D3 as its center. In this case, the control unit 150 may be adapted to control the output of the first light source 121 in coordination with the rotation of the substrate 110. In this manner, light irradiation with a predetermined brightness distribution can be achieved on the irradiating region 121a.

In the manner described above, the light distribution pattern of the light emitting module 100 can be changed.

The control unit 150, for example, may be adapted to estimate the position of the optical axis of the light emitted by each light source 120 and exiting the first lens 131 on the circular track from the position of the light source 120 before rotation and the rotational speed, the number of rotation, or the like of the motor 141. The control unit 150 may be adapted to estimate the position of the optical axis of the light emitted by each light source 120 and exiting the first lens 131 on the circular track by using a detection result of a rotational angle detection sensor such as a rotary encoder. Specifically, a rotary angle detection sensor detects the rotational angle of the substrate 110 from a reference position in the state in which the substrate 110 is not rotating. The position of the optical axis of the light emitted by each light source 120 and exiting the first lens 131 on the circular track during rotation can be estimated based on the rotational angle of the substrate 110.

The effect of this embodiment will be described next.

A light emitting module 100 according to this embodiment includes a substrate 110, a plurality of light sources 120 secured on the substrate 110 and generating individually controllable outputs, a first lens 131 provided above the light sources and on which the light emitted from the light sources 120 becomes incident, and a drive unit 140 capable of rotating the substrate 110. The light sources 120 include a first light source 121 and a second light source 122. The angle θ1 formed by the axis of rotation D3 of the substrate 110 and the optical axis D21 of the light emitted by the first light source 121 and exiting the first lens 131 differs from the angle θ2 formed by the axis of rotation D3 and the optical axis D22 of the light emitted by the second light source 122 and exiting the first lens 131. The second light emitted by the second light source 122 and exiting the first lens 131 can irradiate a first circular track 122b having the axis of rotation D3 as its center. Accordingly, the light distribution pattern of the light emitting module 100 can be changed.

Furthermore, because the light from each light source 120 becomes incident on a single first lens 131, the light emitting module 100 of this embodiment is structurally simple and compact as compared to a light emitting module having lenses that individually correspond to multiple light sources 120. The light emitting module has good design quality because of a single first lens 131 that is visually recognizable from the outside. Because multiple light sources 120 are arranged under a single first lens 131, the light sources 120 can be easily arranged close together. This makes it easy to increase the number of irradiating regions 121a, 122a, 123a, 124a, 125a, and 126a whose brightness can be individually controlled while reducing the size of the light emitting module 100.

Furthermore, the light sources include a third light source 123, and the third light emitted by the third light source 123 and exiting the first lens 131 can irradiate a second circular track 123b around the axis of rotation D3 that is different from the first circular track 122b. In other words, there are two or more brightness-controllable irradiating regions i.e., 121a, 122a, and 123a. This can increase the light distribution pattern variations for the light emitting module 100.

Furthermore, the first lens 131 is separated from the substrate 110. In other words, the first lens 131 does not rotate with the substrate 110. Because the first lens 131 overlaps the substrate 110 in the Z direction, the first lens 131 can reduce the external exposure of the substrate 110 and light sources 120 that rotate.

Moreover, the first lens 131 is a solid of revolution formed around the axis of rotation D3 which coincides with the optical axis of the first lens 131. This can simplify the shape of the first lens 131. Providing multiple second light sources 122 under such a first lens 131 at substantially the same distance from the axis of rotation D3 allows a single irradiating region 122a to be irradiated by the multiple second light sources 122. This can improve the brightness of the irradiating region 122a.

Furthermore, the light emission face 131b of the first lens 131 in this embodiment is flat. Accordingly, it is more difficult for foreign matter to remain on the light emission face 131b than an uneven light emission face. This eliminates the need for a cover member. Not having a cover member can lessen the luminous intensity decline in the light emitted from the light emitting module 100.

Moreover, the light incident face 131a of the first lens 131 is convex. Thus, the light emitted by each light source 120 and exiting the first lens 131 advances towards the optical axis of the first lens 131. This can reduce the blocking of the light exiting the first lens 131 by the peripheral parts of the light emitting module 100 such as the casing 191.

The light sources 120 are arranged at the intersections of the first straight lines L1 extending in the X direction and arranged in the Y direction orthogonal to the X direction and the second straight lines L2 extending in the Y direction and arranged in the X direction in a top view. A matrix arrangement of the light sources 120 like this facilitates the arrangement of a plurality of light sources 120 on the substrate 110.

Furthermore, a light shielding member 161 is disposed between the light sources 120. This can reduce color non-uniformity of the light emitted from the light sources 120.

The light emitting module 100 further includes a light transmissive member 162 disposed over and across all of the light sources 120. This can make less conspicuous the spaces between the light emitted from adjacent light sources 120 to appear as dark spots.

Moreover, the light transmissive member 162 contains a light diffusing material. This can suitably make less conspicuous the spaces between the light emitted from adjacent light sources 120 to appear as dark spots.

Second Embodiment

A second embodiment will be described next.

Figure 8A:
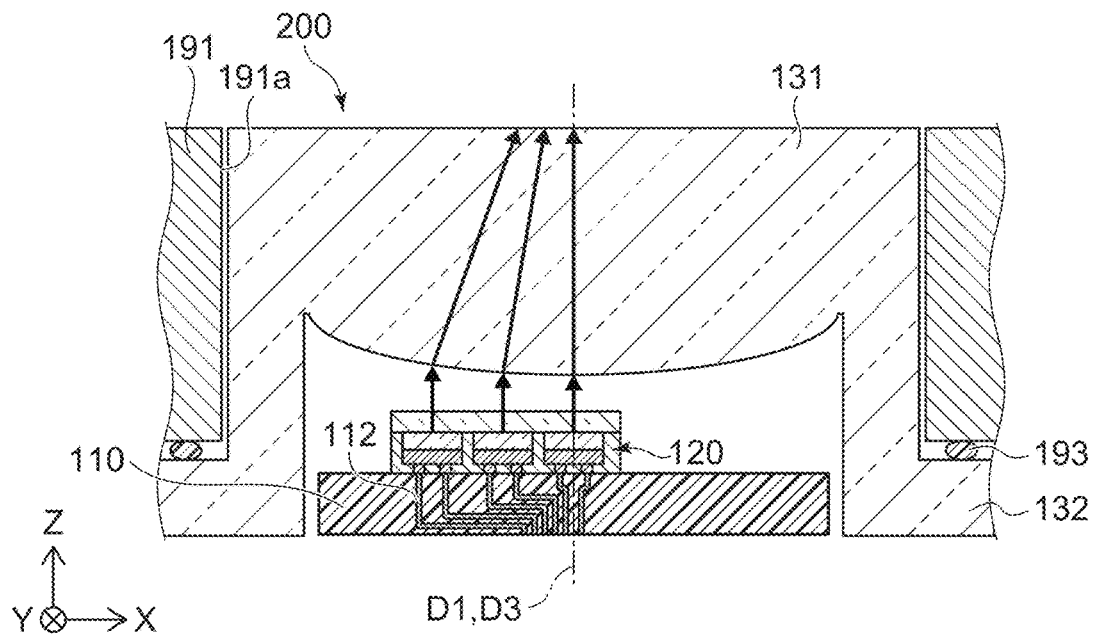
FIG. 8A is a cross-sectional view showing a portion of a light emitting module according to a second embodiment.
Figure 8B:
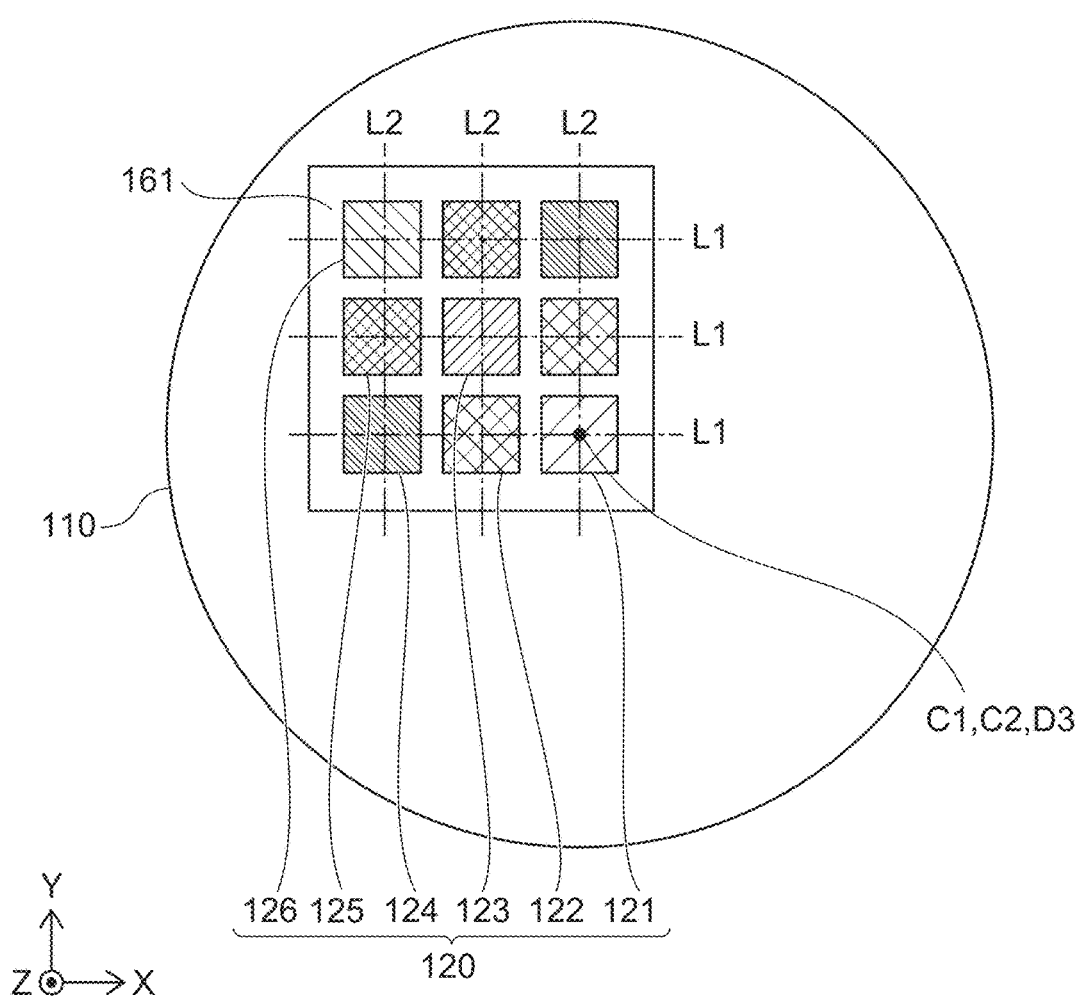
FIG. 8B is a top view of the substrate, the light sources, and the light shielding member shown in FIG. 8A.

FIG. 8A is a cross-sectional view of a portion of a light emitting module according to this embodiment. FIG. 8B is a top view of the substrate, the light sources, and the light shielding member shown in FIG. 8A.

A light emitting module 200 according to this embodiment differs from the light emitting module 100 according to the first embodiment such that it has nine light sources 120.

In the description below, the differences from the first embodiment will be focused basically, and similar elements to those in the first embodiment might be omitted. The same applies to the other embodiments and variations discussed later.

As shown in FIG. 8B, the light sources 120 are arranged at the intersections of three first straight lines L1 and three second straight lines L2. The center C2 of the light source 121 among the light sources 120 that is located furthest on the +X side and furthest on the −Y side is positioned on the axis of ration D3. Such a light emitting module 200, similar to the first embodiment, can also have six irradiating regions the brightness of which can be individually controlled. The plurality of irradiating regions whose brightness is individually controllable is not limited to this, and can be modified by altering the number or the layout of the light sources.

Third Embodiment

A third embodiment will be described next.

Figure 9:
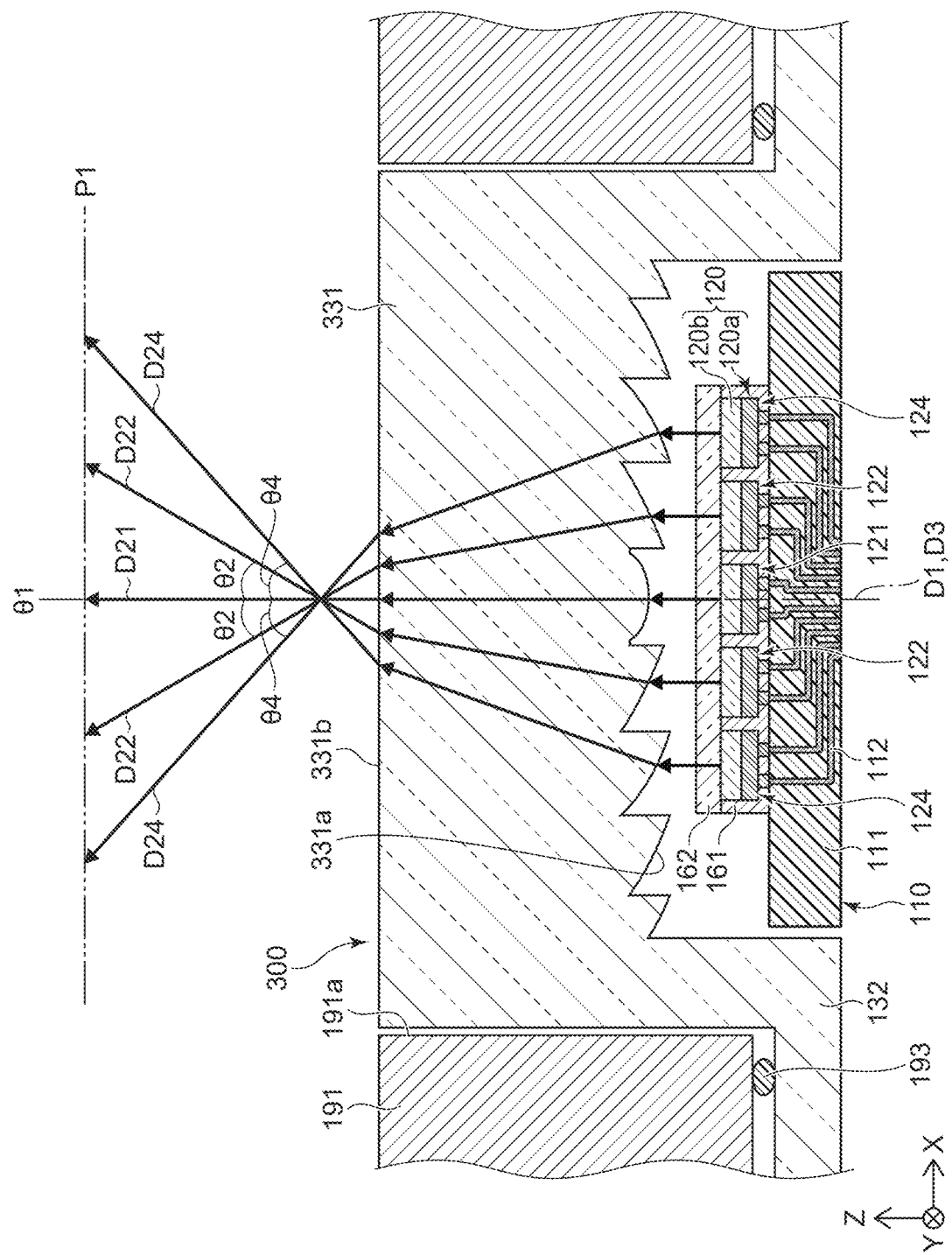
FIG. 9 is a cross-sectional view showing a portion of a light emitting module according to a third embodiment.

FIG. 9 is a cross-sectional view of a portion of a light emitting module according to this embodiment.

A light emitting module 300 according to this embodiment differs from the light emitting module 100 according to the first embodiment in terms of the shape of the first lens 131.

The first lens 331 is a Fresnel lens. The light incident face 331a of the first lens 331 has a Fresnel profile. Here, a "Fresnel profile" refers to a sawtooth cross section. The light emission face 331b of the first lens 331 is flat and substantially parallel to the X-Y plane.

Similar to the first embodiment, the angles formed by the axis of rotation D3 and the optical axes of the light emitted by the light sources 121, 122, 123, 124, 125, and 126 and exiting the first lens 331 in this embodiment differ from one another.

The effect of this embodiment will be explained next.

The first lens 331 is a Fresnel lens in which the light incident face 331a has a Fresnel profile. The first lens 331 which is a Fresnel lens, for example, is a lens in which the curved face of the first lens 131 is divided into concentric annular sections, each section being angled and reduced in thickness. Furthermore, the first lens 331 externally visible being a Fresnel lens can improve the design quality.

Fourth Embodiment

A fourth embodiment will be described next.

Figure 10:
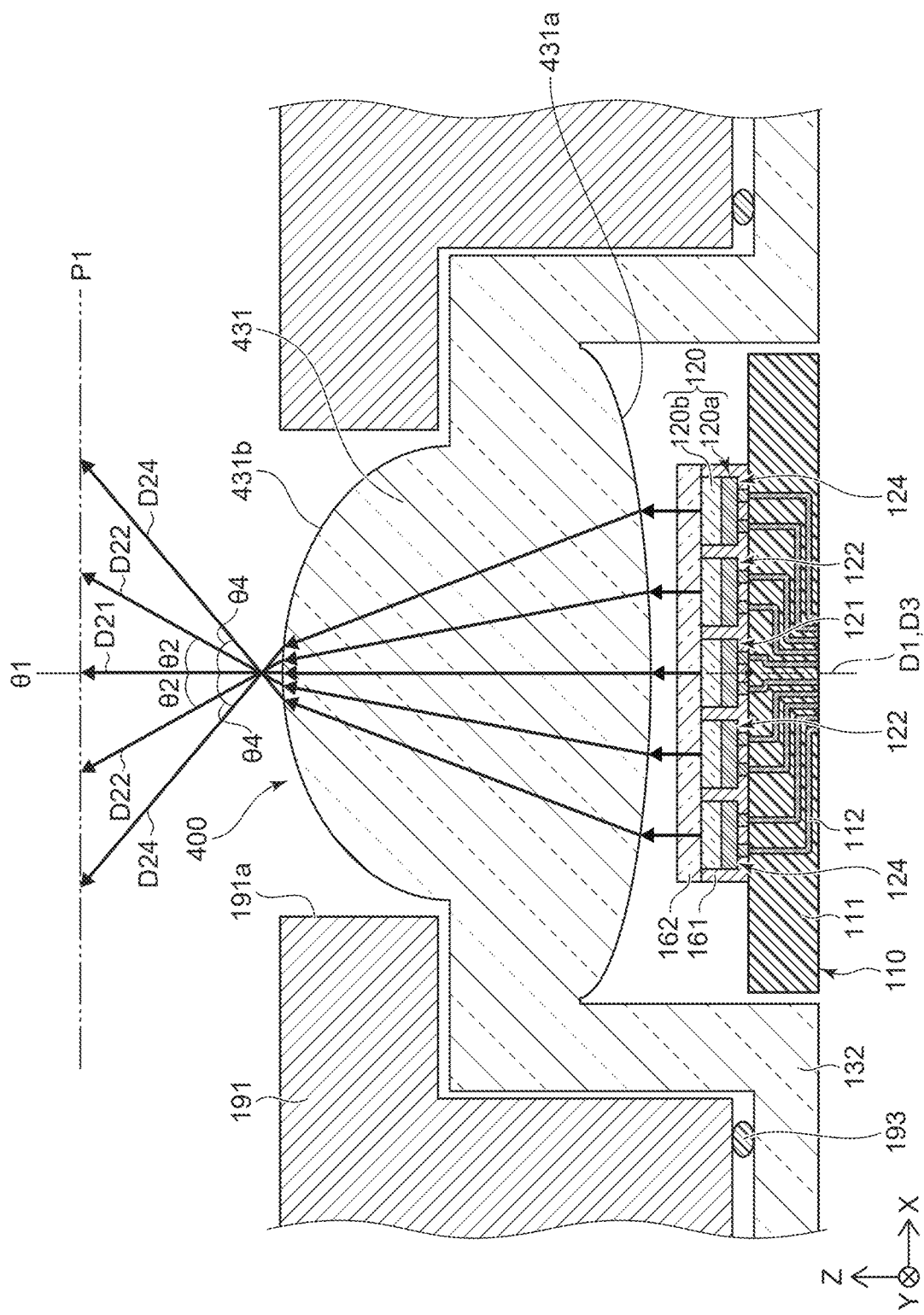
FIG. 10 is a cross-sectional view showing a portion of a light emitting module according to a fourth embodiment.
Figure 11:
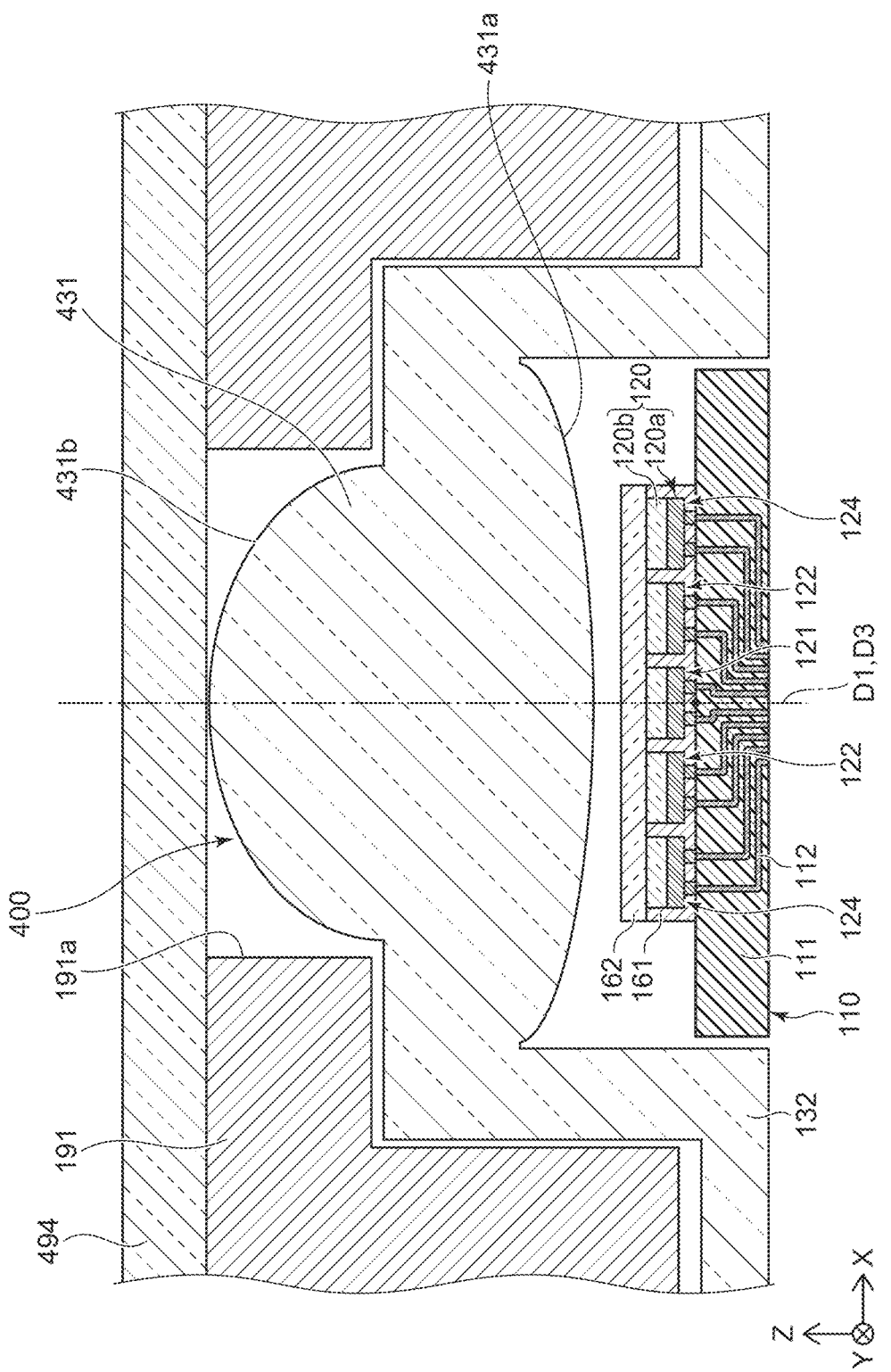
FIG. 11 is a cross-sectional view of the light emitting module shown in FIG. 10 when a cover member is provided on the module.

FIG. 10 is a cross-sectional view of a portion of a light emitting module according to this embodiment. FIG. 11 is a cross-sectional view of the light emitting module shown in FIG. 10 on which a cover member is provided.

A light emitting module 400 according to this embodiment differs from the light emitting module 100 according to the first embodiment in terms of the shape of the first lens 431.

The first lens 431 is a convex lens. Both the light incident face 431a and the light emission face 431b of the first lens 431 are convex faces. In this embodiment, the light incident face 431a and the light emission face 431b of the first lens 431 are asymmetrical. Specifically, the top view shapes of the light incident face 431a and the light emission face 431b are both circular, and the diameter of the light incident face 431a is larger than the diameter of the light emission face 431b in the top view. Furthermore, the curvature of the light incident face 431a is smaller than the curvature of the light emission face 431b. When the curvature of the light incident face of the first lens is small, the light from the light sources becomes incident on the first lens efficiently. When the curvature of the light emission face is large, stray light is reduced and contrast is improved. However, the shapes of the light incident face and the light emission face are not limited to those described above. For example, the curvature of the light incident face of the first lens may be larger than the curvature of the light emission face. In this case, the light from the light sources can be refracted and bent greatly by the first lens to achieve a wide angle light distribution. The light incident face and the light emission face may be substantially symmetrical in the Z direction.

The majority of the light emitted by each light source 120 refracted and become incident on the light incident face 431a is refracted again at the light emission face 431b. Similar to the first embodiment, the angles formed by the axis of rotation D3 and the optical axes of the light emitted by the light sources 121, 122, 123, 124, 125, and 126 and exiting the first lens 431 differ from one another.

The effect of this embodiment will be explained next.

The light incident face 431a and the light emission face 431b of the first lens 431 are both convex faces. As such, the angle formed by the axis of rotation D3 and the optical axis of the light emitted by each light source 120 and exiting the first lens 431 can be easily adjusted by way of adjusting the shapes of the two convex faces, i.e., the light incident face 431a and the light emission face 431b.

As shown in FIG. 11, a cover member 494 having light transmissivity may be provided above the first lens 431. This can reduce the chance of allowing the convex light emission face 431b to be externally exposed to be bumped and damaged. At this time, a sealing member 193 does not have to be disposed.

Fifth Embodiment

A fifth embodiment will be described next.

Figure 12:
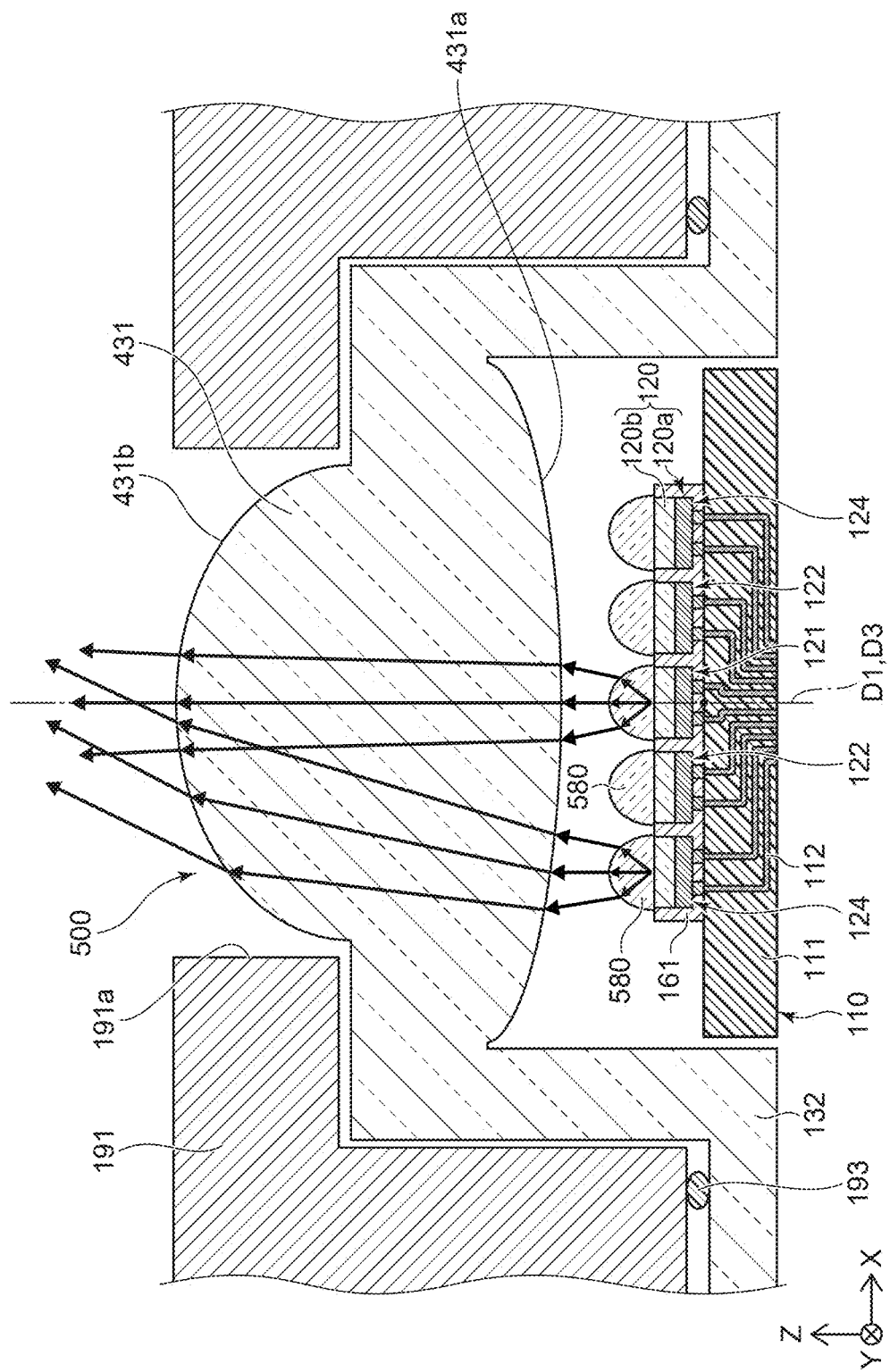
FIG. 12 is a cross-sectional view showing a portion of a light emitting module according to a fifth embodiment.

FIG. 12 is a cross-sectional view of a portion of a light emitting module according to this embodiment.

A light emitting module 500 according to this embodiment differs from the light emitting module 400 according to the fourth embodiment by having no transmissive member 162 and further including multiple second lenses 580.

The second lenses 580 are individually disposed on the light sources 120. Each second lens 580 is a convex lens, for example. The second lenses 580 substantially have the same shape. However, the shapes of the second lenses do not have to be identical. Each second lens may be apart from the corresponding light source. The shortest distance between the first lens 431 and the second lenses 580 is, for example, 50 μm to 1000 μm.

The light emitted by each light source 120 becomes incident on the corresponding second lens 580. The light exiting each second lens 580 becomes incident on the first lens 431.

The effect of this embodiment will be explained next.

The light emitting module 500 according to this embodiment further includes second lenses 580 located between the first lens 431 and the light sources 120, and disposed on the light sources 120. This allows the second lenses 580 to collect the light from the light sources 120 to be incident on the first lens 431.

Furthermore, the angle formed by the axis of rotation D3 and the optical axis of the light emitted by each light source 120 and exiting the first 431 can be easily finely adjusted by each second lens 580.

Sixth Embodiment

A sixth embodiment will be described next.

Figure 13:
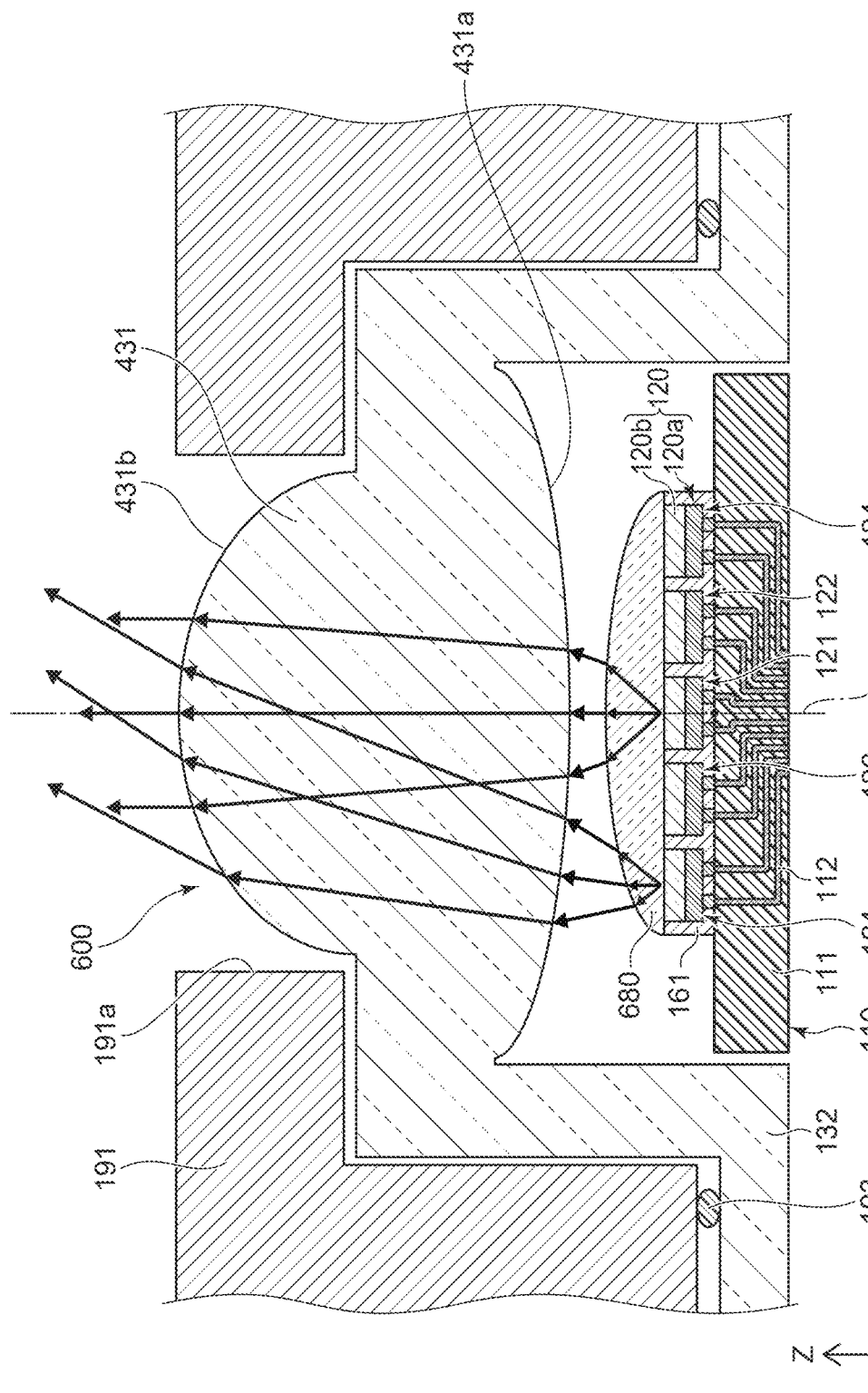
FIG. 13 is a cross-sectional view showing a portion of a light emitting module according to a sixth embodiment.

FIG. 13 is a cross-sectional view of a portion of a light emitting module according to this embodiment.

A light emitting module 600 according to this embodiment differs from the light emitting module 500 according to the fifth embodiment such that, in place of multiple second lenses 580, a single second lens 680 is positioned between the first lens 431 and the light sources 120, and disposed over and across all of the light sources 120.

The second lens 680 is, for example, a convex lens. The second lens 680 is in contact with the upper faces of the light sources 120 and the upper face of the light shielding member 161. However, the second lens may be set apart from the light sources and the light shielding member.

The light emitted by each light source 120 becomes incident on the second lens 680. The light exiting the second lens 680 becomes incident on the first lens 431.

The effect of this embodiment will be explained next.

In the light emitting module 600 according to this embodiment, the second lens 680 is disposed across all of the light sources 120. The light emitting module 600 also allows the second lens 680 to collect the light from each of the light sources 120 before becoming incident on the first lens 431.

The second lens 680 is disposed over and across all of the light sources 120. Providing a single second lens 680 like this can reduce the plurality of components of the light emitting module 600.

Furthermore, the angles formed by the axis of rotation D3 and the optical axes of the light from the light sources 120 and exiting the first lens 431 may be finely adjusted by using the second lens 680.

Variations

Figure 14A:
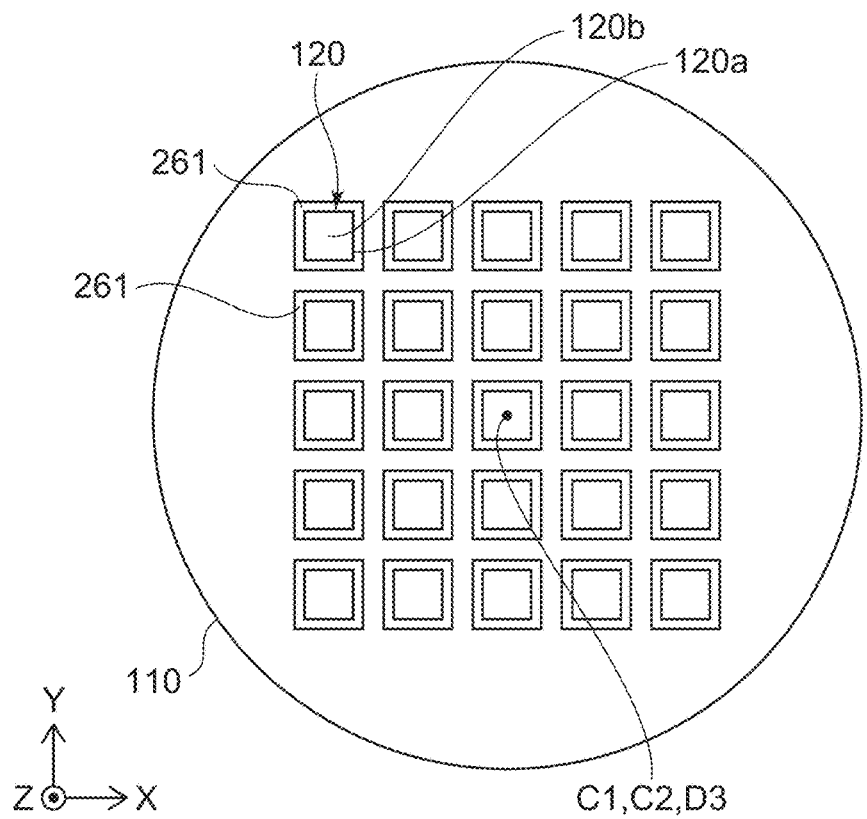
FIG. 14A is a top view of a variation of the light shielding member.

FIG. 14A is a top view of a variation of the light shielding member.

As shown in FIG. 14A, the light shielding members 261 may individually surround the light sources 120. Light transmissive members may be disposed individually on the wavelength conversion members 120b of the light sources 120, and the lateral faces of the light transmissive members may be covered by the light shielding member 261.

Figure 14B:
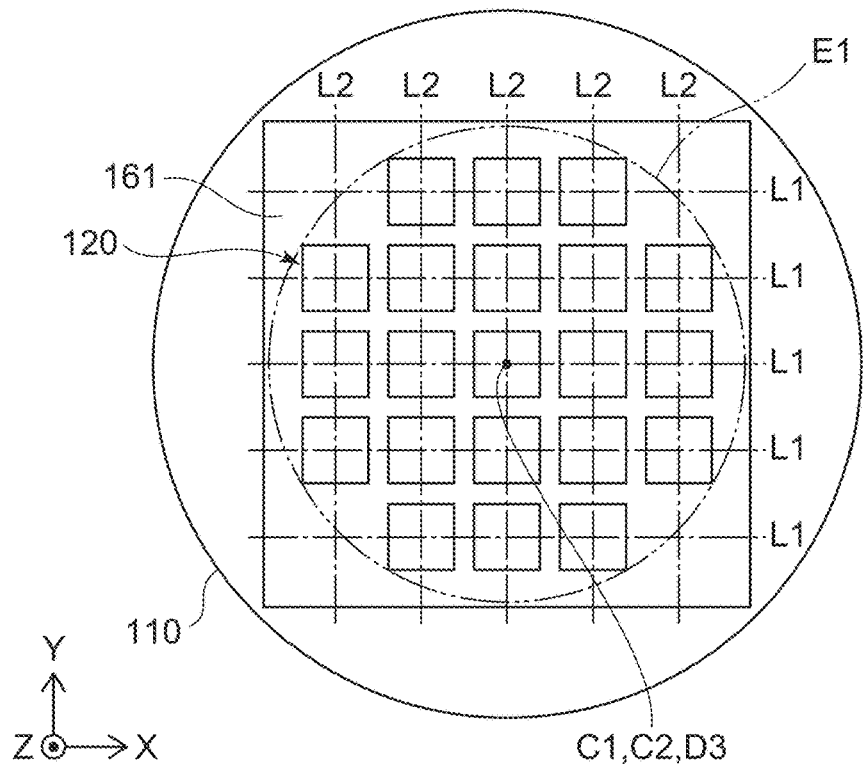
FIG. 14B is a top view of a variation of the layout of the light sources.

FIG. 14B is a top view of a variation of the layout of light sources.

As shown in FIG. 14B, the light sources 120 do not have to be disposed at the intersections of the first straight lines L1 and the second straight lines L2 located at the corners. In other words, no light source 120 is provided at the intersection located furthest on the +X side and furthest on the +Y side, the intersection located furthest on the −X side and furthest on the +Y side, the intersection located furthest on the +X side and furthest on the −Y side, and the intersection located furthest on the −X side and furthest on the −Y side. In such a case, the light sources 120 can be arranged in correspondence with the circle E1 having the axis of rotation D3 as its center.

Figure 15A:
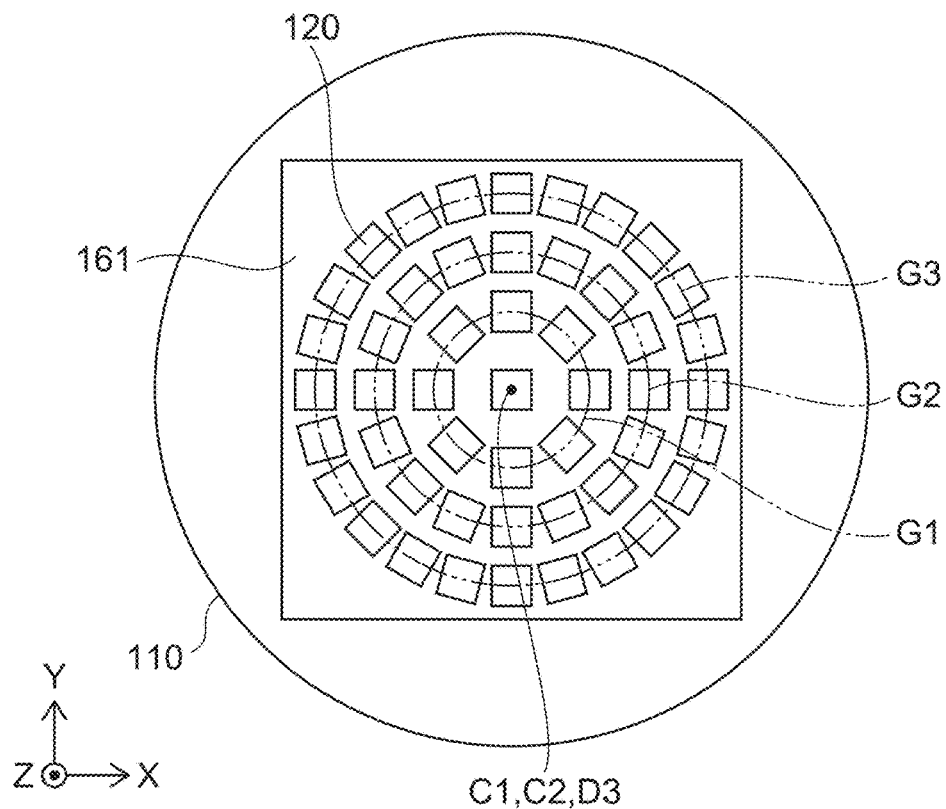
FIG. 15A is a top view of a variation of the layout of the light sources.

FIG. 15A is a top view of a variation of the layout of light sources.

As shown in FIG. 15A, on the substrate 110, the light sources 120 may be arranged on the circumferences G1, G2, and G3 that are arranged around the axis of rotation D3 and have radii different from one another. In other words, on each of the circumferences G1, G2, and G3, multiple light sources 120 are circumferentially arranged at substantially equal intervals. In such a case, the light sources 120 can be easily grouped by the distances from their centers C2 to the axis of rotation D3, thereby facilitating the design of the first lens 131 and the control applied by the control unit 150.

The larger the angle formed by the axis of rotation and the optical axis of the light emitted by a light source 120 and exiting the first lens 131, the faster the circumferential speed of the optical axis of the light source 120 moving on the circular track results. For this reason, the farther the distance of the irradiating region from the axis of rotation, the lower the brightness tends to result. In this variation, the number of light sources 120 that can be arranged increases as the diameter of the circumference increases. By arranging more light sources on a larger diameter circumference, the decline in the brightness of the irradiating region achieved by the light exiting the first lens 131 can be lessened. This can reduce the brightness nonuniformity among the irradiating regions attributable to a circumferential speed difference.

Figure 15B:
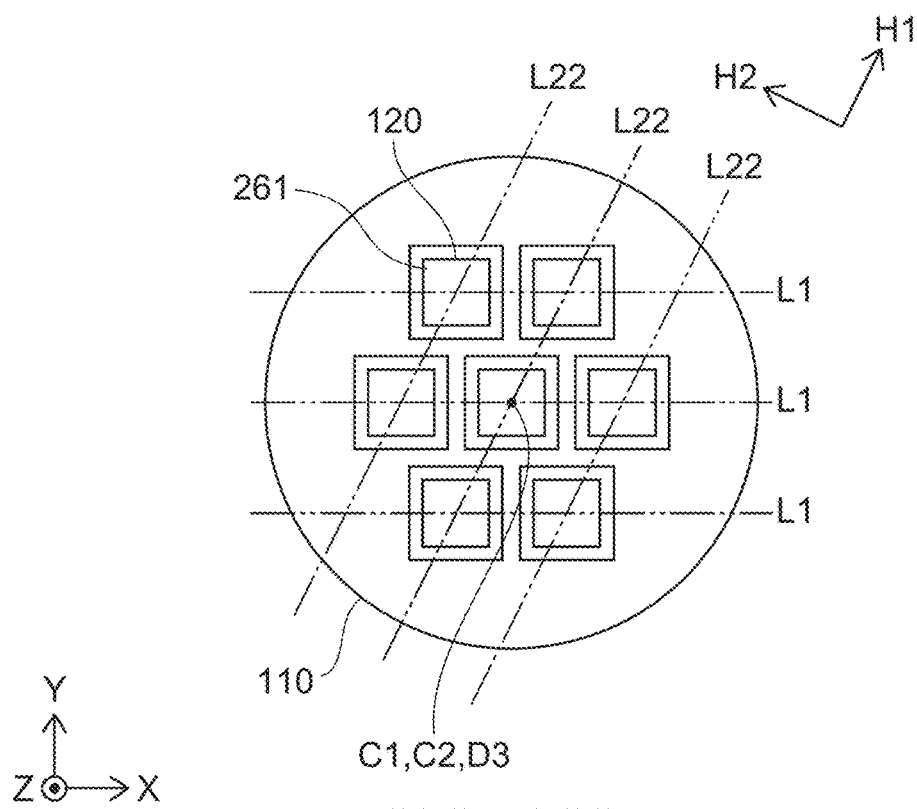
FIG. 15B is a top view of a variation of the layout of the light sources.

FIG. 15B is a top view of a variation of the layout of light sources.

As shown in FIG. 15B, the light sources 120 may be arranged at the intersections of the first straight lines L1 and the second straight lines L22. The first straight line L1 extend in the X direction and are arranged in the Y direction. The second straight lines L22 extend in the H1 direction which intersects the X and Y directions and are arranged in the H2 direction orthogonal to the H1 direction. For example, adjacent light sources 120 in the H1 direction are such that their centers are positioned at one-half of the distance between the centers C2 of adjacent light sources 120 in the X direction in a top view. In such a case, the light sources 120 can be easily grouped by the distances from their centers C2 to the axis of rotation D3, thereby facilitating the design of the first lens 131 and the control applied by the control unit 150.

Furthermore, the light sources can be arranged such that the number of light sources whose centers C2 are more distant from the axis of rotation D3 is greater. This can lessen the brightness decline in the irradiating region of the light emitted by the light sources 120 whose centers C2 are more distant from the axis of rotation D3 and exiting the first lens 131, thereby reducing the brightness nonuniformity among the irradiating regions attributable to a circumferential speed difference.

Figure 16A:
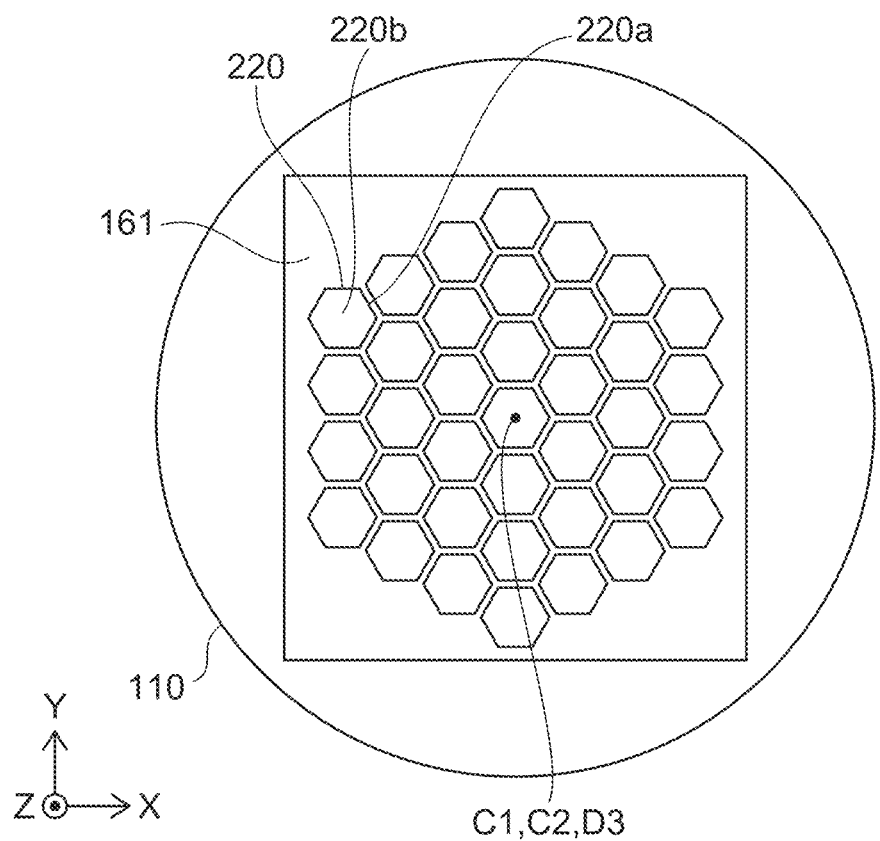
FIG. 16A is a top view of a variation of the shape and layout of the light sources.

FIG. 16A is a top view of a variation of the light source shape and layout.

Figure 16B:
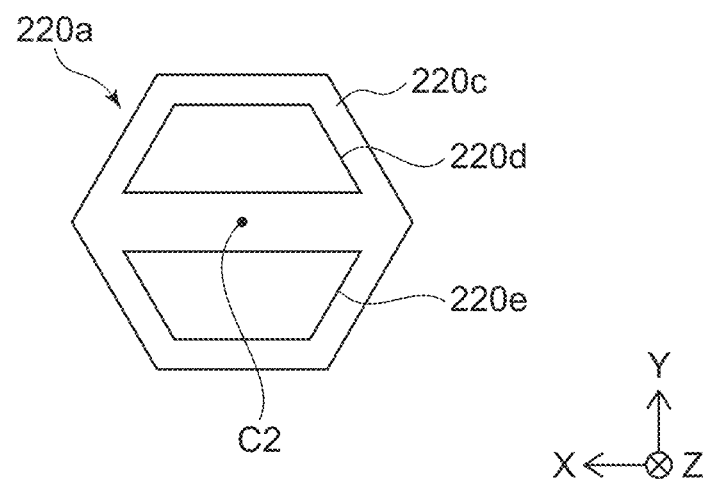
FIG. 16B is a bottom view enlarging one of the light sources in FIG. 16A.

FIG. 16B is a bottom view of a light source shown in FIG. 16A.

As shown in FIG. 16A, the shape of each light source 220 may be a hexagon in the top view. The light sources 220 may be arranged in a honeycomb shape. In the case of such an arrangement, the light sources 120 can be easily grouped by the distances from their centers C2 to the axis of rotation D3, thereby facilitating the design of the first lens 131 and the control applied by the control unit 150.

Furthermore, the light sources 220 can be arranged such that the number of light sources whose centers C2 are more distant from the axis of rotation D3 is greater. This can lessen the brightness decline in the irradiating region of the light emitted by the light source 220 whose centers C2 are more distant from the axis of rotation D3 and exiting the first lens 131, thereby reducing the brightness nonuniformity among the irradiating regions attributable to a circumferential speed difference.

As shown in FIG. 16B, the pair of electrodes 220d and 220e of the light emitting element 220a are arranged in the Y direction orthogonal to the X direction in which one of the sides of the perimeter extends. The bottom view shape of each of the electrodes 220d and 220e is a trapezoid. The pair of electrodes 220d and 220e are arranged such that they have point symmetry relative to the center C2 of the light source 220. The shape and the direction of arrangement of the electrodes 220d and 220e can be suitably changed in accordance with the shape of the light source 220.

Figure 17A:
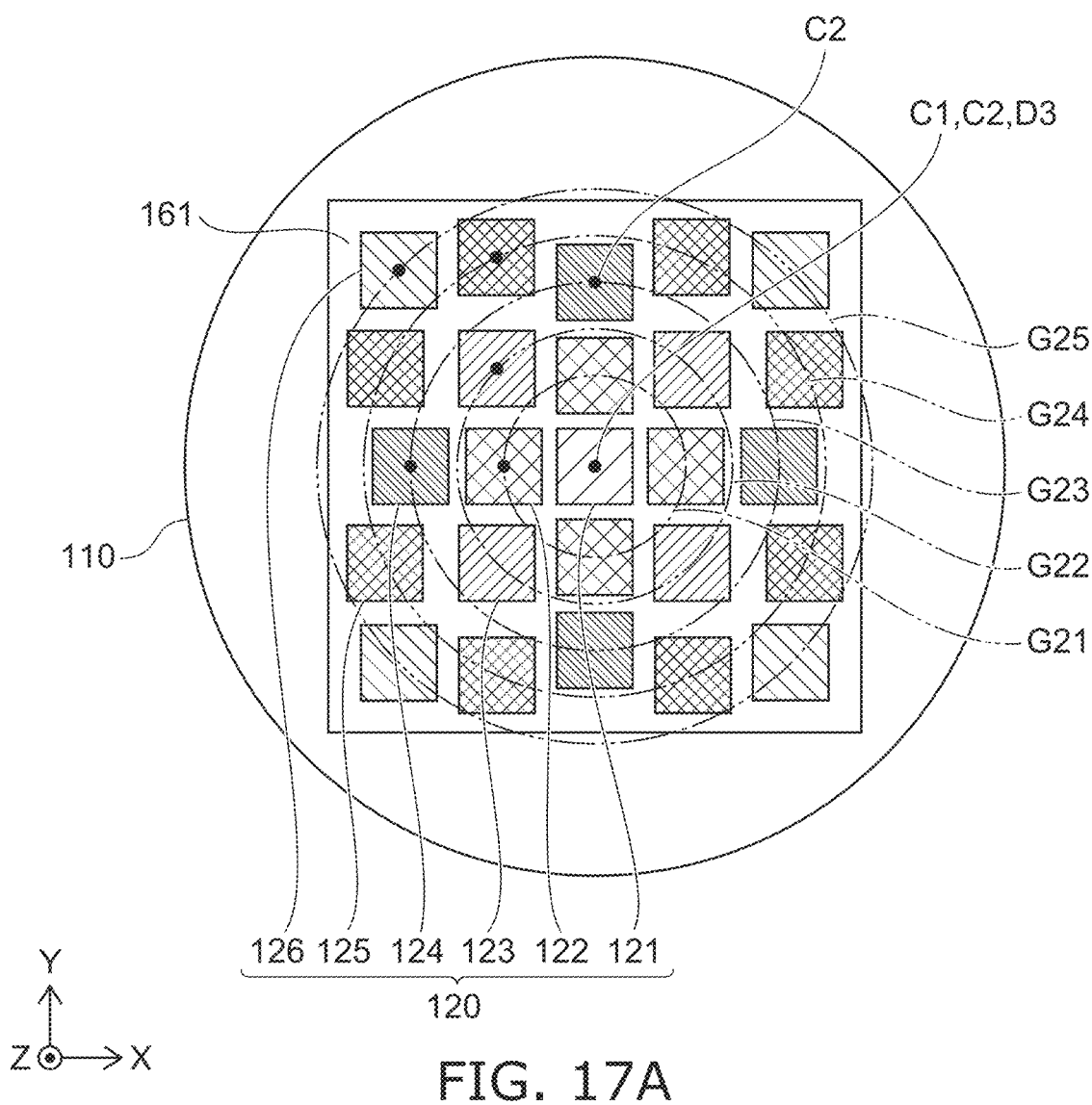
FIG. 17A is a top view of a variation of the layout of the light sources.
Figure 17B:
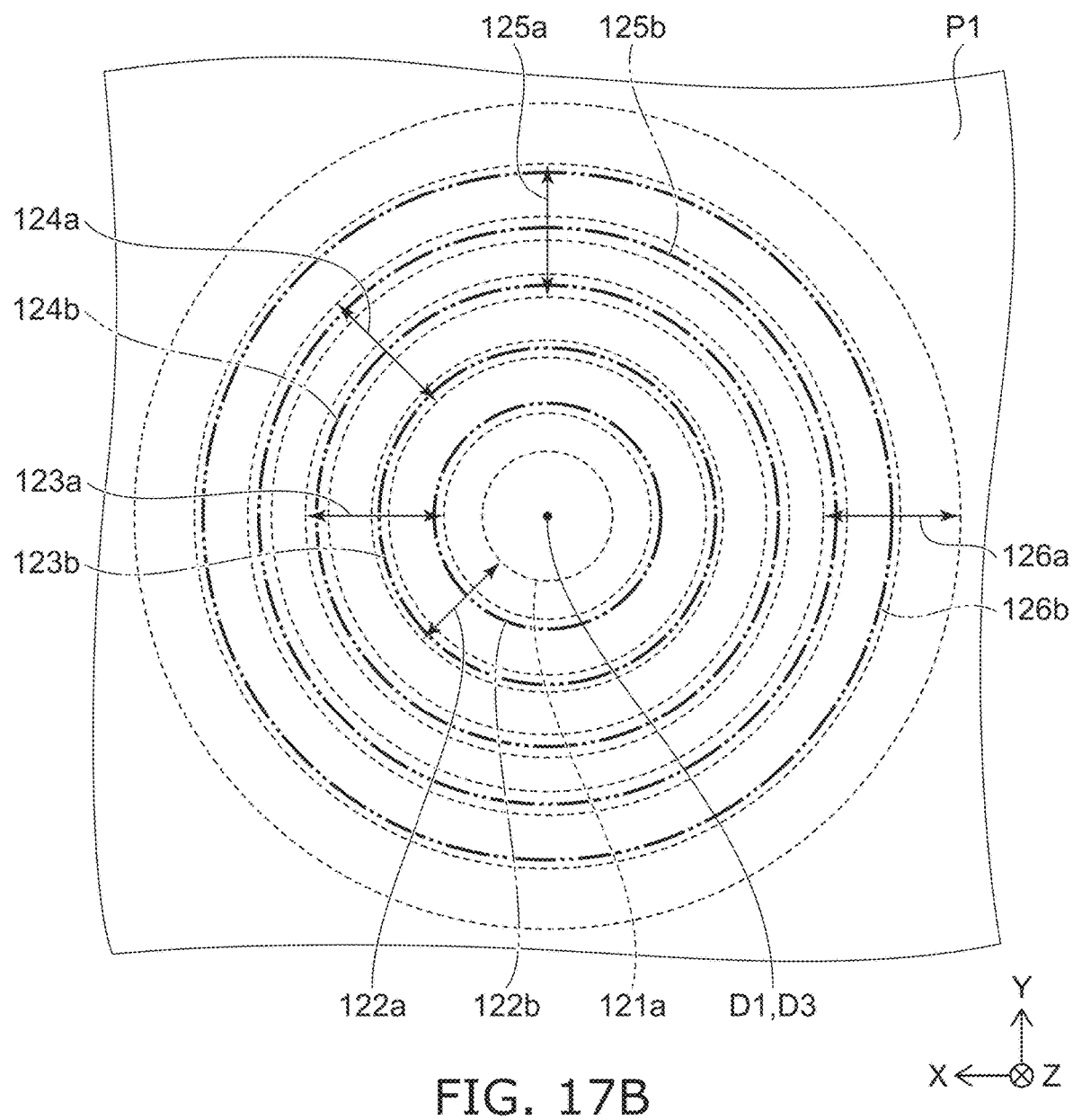
FIG. 17B is a schematic diagram of an irradiated plane showing the irradiating regions of the light emitted by the light sources and exiting the lens.

FIG. 17A is a top view of a variation of the layout of light sources. FIG. 17B is a schematic diagram of an irradiated plane showing the irradiating regions of the light emitted by the light sources and exiting the lens.

As shown in FIG. 17A, the light sources 122, 123, 124, 125, and 126 may be arranged such that their respective centers C2 are positioned on the circumferences G21, G22, G23, G24, and G25 located at equal intervals around the axis of rotation D3. Specifically, the centers C2 of the second light sources 122 are positioned on the circumference G21, the centers C2 of the third light sources 123 are positioned on the circumference G22 located outward from the circumference G21, the centers C2 of the fourth light sources 124 are positioned on the circumference G23 located outward from the circumference G22, the centers C2 of the fifth light sources 125 are positioned on the circumference G24 located outward from the circumference G23, and the centers C2 of the sixth light sources 126 are positioned on the circumference G25 located outward from the circumference G24. This can substantially space the circular tracks 122*b*, 123*b*, 124*b*, 125*b*, and 126*b* at equal intervals as shown in FIG. 17B without adjusting the curvature of the first lens 131. At this time, adjacent irradiating regions among the irradiating regions 122*a*, 123*a*, 124*a*, 125*a*, and 126*a* partly overlap. Adjacent irradiating regions do not have to partly overlap.

Figure 18A:
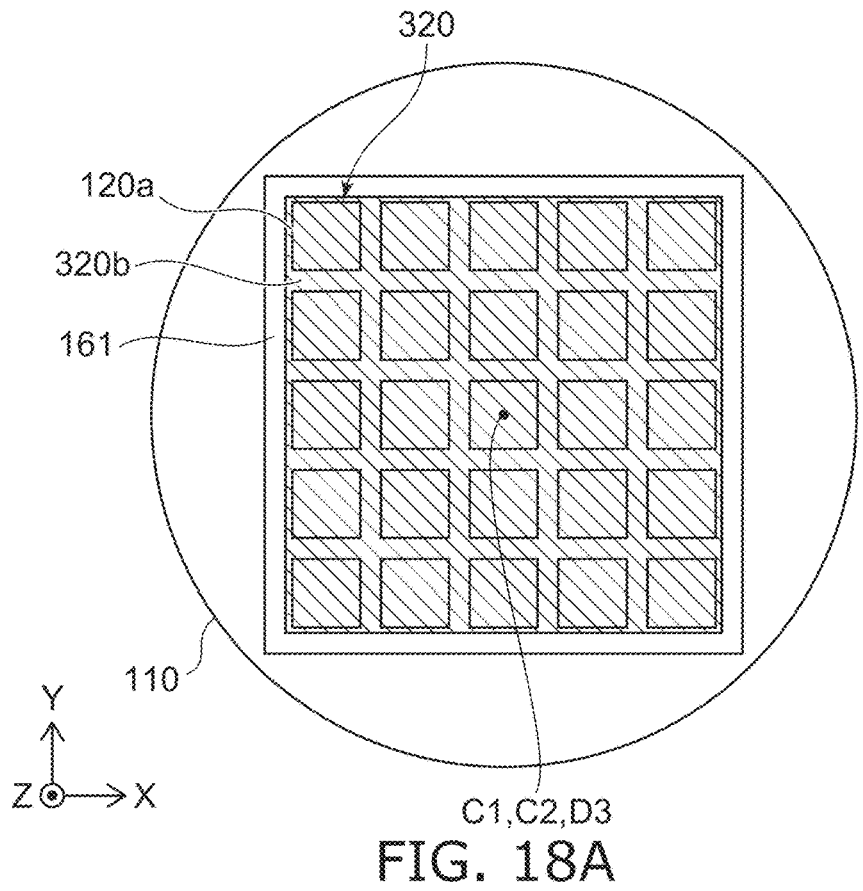
FIG. 18A is a top view of a variation of the wavelength conversion member.

FIG. 18A is a top view of a variation of the wavelength conversion member.

In FIG. 18A, for ease of understanding, the location where the wavelength conversion member 320*b* is provided is shown with a diagonal hatch pattern.

As shown in FIG. 18A, a single wavelength conversion member 320*b* may be disposed over and across all of the light emitting elements 120*a*. In such a case, each portion where a light emitting element 120*a* overlaps the wavelength conversion member 320*b* in the Z direction corresponds to a light source 320.

Figure 18B:
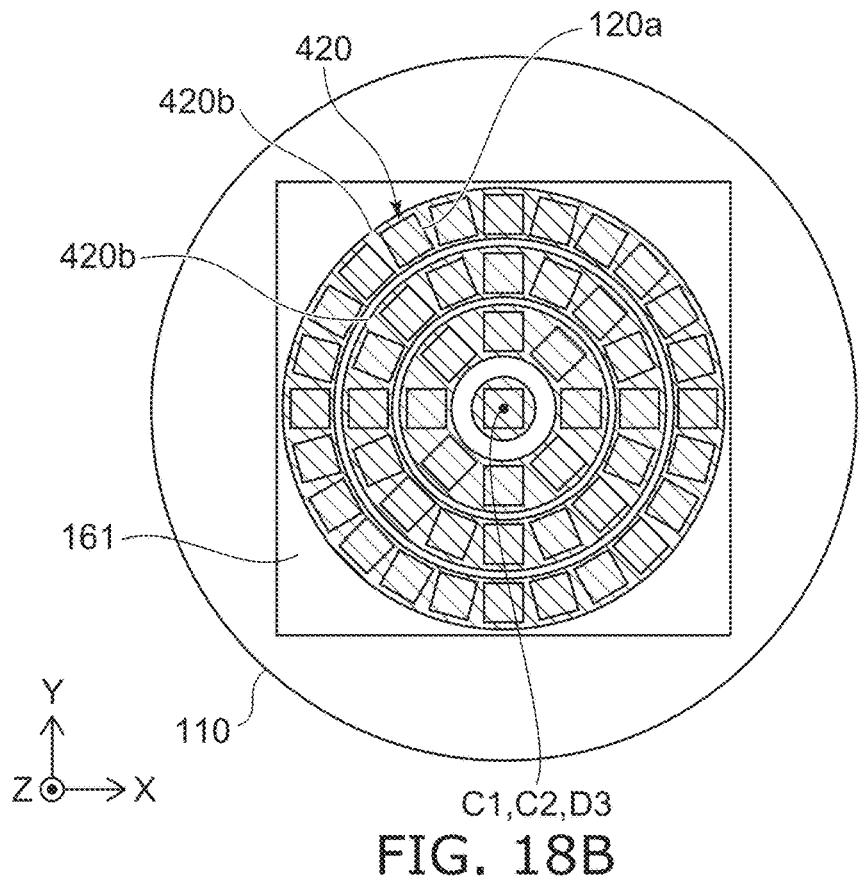
FIG. 18B is a top view of a variation of the wavelength conversion member.

FIG. 18B is a top view of a variation of the wavelength conversion member.

In FIG. 18B, for ease of understanding, the locations where the wavelength conversion members 420*b* are provided are shown with a diagonal hatch pattern.

As shown in FIG. 18B, multiple annular wavelength conversion members 420*b* may be disposed such that each wavelength conversion member 420*b* is disposed across annularly arranged light emitting elements 120*a*. In this case, each portion where a light emitting element 120*a* overlaps a wavelength conversion member 420*b* in the Z direction corresponds to a light source 420 as well.

Figure 19A:
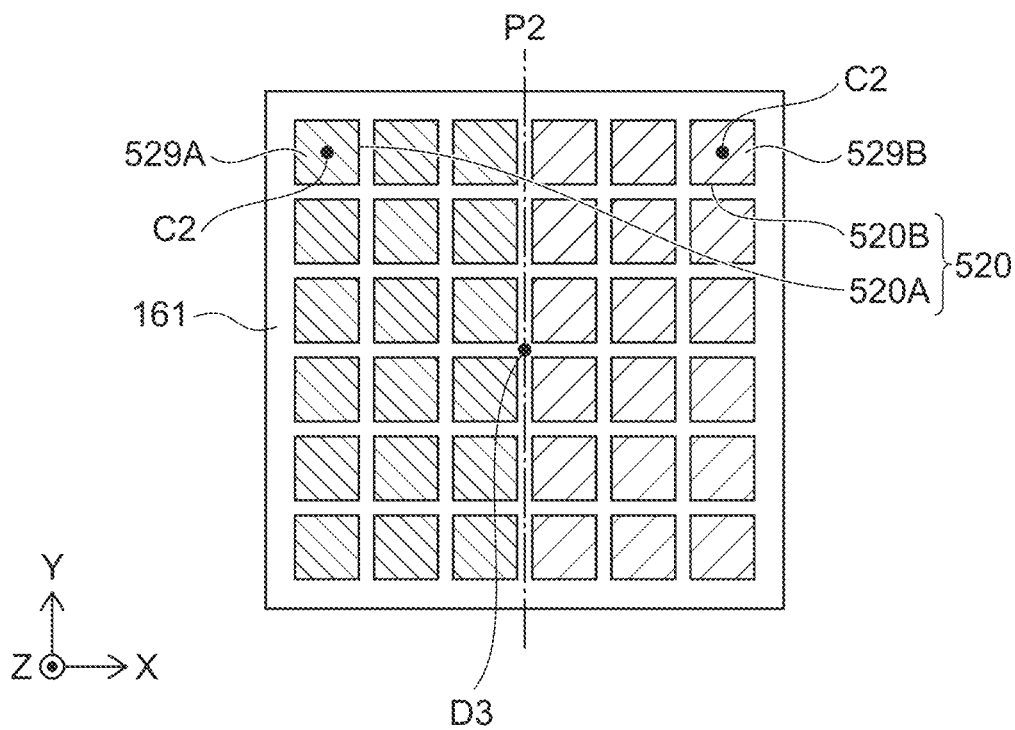
FIG. 19A is a top view of a variation of the wavelength conversion member.

FIG. 19A is a top view of a variation of the wavelength conversion member.

In FIG. 19A, two types of wavelength conversion members 529A and 529B are shown with different diagonal hatch patterns.

As shown in FIG. 19A, a group of light sources 520A among the light sources 520 may have wavelength conversion members 529A emitting light of the chromaticity equivalent to one another and another group of light sources 520B among the light sources 520 may have wavelength conversion members 529B emitting light of different chromaticity from that of the light emitted by the wavelength conversion members 529A. In other words, the chromaticity of the light emitted by the light sources 520A differs from the chromaticity of the light emitted by the light sources 520B. However, the method of varying the chromaticity of multiple light sources is not limited to that described above. For example, the peak wavelength of the light emitted by a light emitting element may be varied.

In FIG. 19A, the number of the light sources 520A is the same as that of the light sources 520B. In a top view, the light sources 520A and the light sources 520B are arranged to have line symmetry with respect to the straight line P2 passing through the axis of rotation D3 and paralleling the Y-axis. The number of the light sources 520A does not have to be the same as that of the light sources 520B.

In such a case, for each light source 520A, there is a light source 520B whose center C2 is equally distanced from the axis of rotation D3. Thus, the light emitted by a light source 520A and exiting the first lens 131 irradiates the same circular track irradiated by the light emitted by the light source 520B, whose center C2 is equally distanced from the axis of rotation D3, and exiting the first lens 131. Accordingly, the color of the light emitted by the light source 520A and exiting the first lens 131 and the color of the light emitted by the light source 520B and exiting the first lens 131 can be mixed. Furthermore, allowing the control unit 150 to control the output ratio of the light from the light sources 520A and 520B can adjust the degree of color mixing. This allows for emission of light that has been tuned to a predetermined color.

Figure 19B:
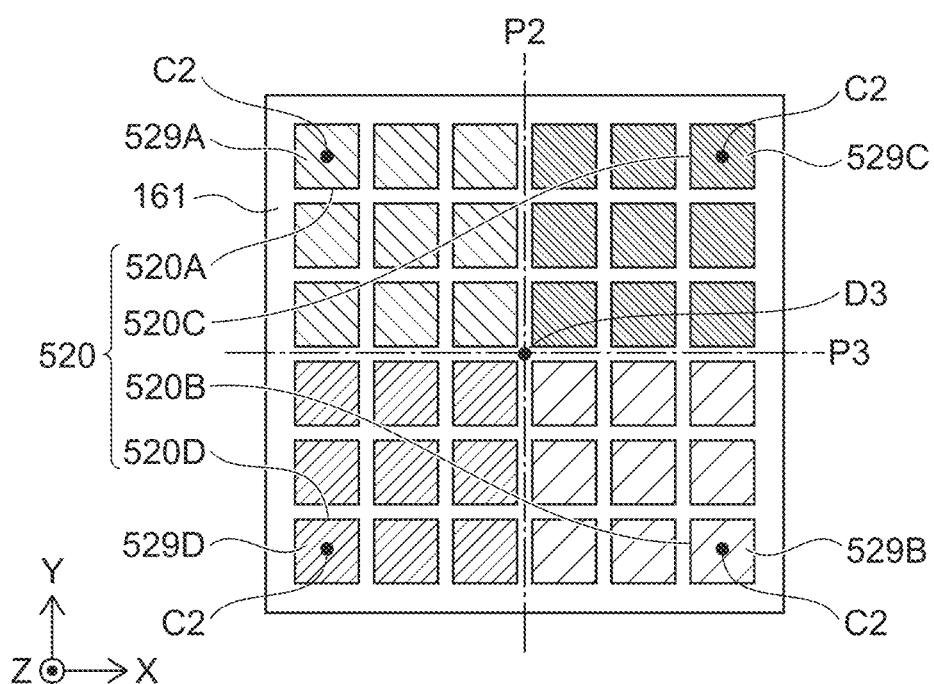
FIG. 19B is a top view of a variation of the wavelength conversion member.

FIG. 19B is a top view of a variation of the wavelength conversion member.

In FIG. 19B, four types of wavelength conversion members 529A, 529B, 529C, and 529D are shown with different diagonal hatch patterns.

As shown in FIG. 19B, four types of wavelength conversion members 529A, 529B, 529C, and 529D emitting light of different chromaticity from one another may be provided.

In FIG. 19B, the numbers of light sources 520A, 520B, 520C, and 520D having wavelength conversion members 529A, 529B, 529C, and 529D, respectively, are the same. In the top view, moreover, the light sources 520A are arranged in the region that is located on the +Y side and the −X side among the four regions divided by the straight line P2 passing through the axis of rotation D3 and paralleling the Y-axis and the straight line P3 orthogonal to the straight line P2. The light sources 520B are arranged in the region on the −Y side and the +X side among the four regions divided by the straight lines P2 and P3. The light sources 520C are arranged in the region on the +Y side and the +X side among the four regions divided by the straight lines P2 and P3. The light sources 520D are arranged in the region on the −Y side and −X side among the four regions divided by the straight lines P2 and P3.

For each light source 520A, there are light sources 520B, 520C, and 520D whose centers C2 are equally distanced from the axis of rotation D3. Thus, the light emitted by each light source 520A and exiting the first lens 131 irradiates the same circular track irradiated by the light emitted by the light sources 520B, 520C, and 520D whose centers C2 are equally distanced from the axis of rotation D3 and exiting the first lens 131. This can mix light of at least two of four chromaticity in each irradiating region. Allowing the control unit 150 to control the output ratio of the light sources 520A, 520B, 520C, and 520D can adjust the degree of color mixing. This allows for emission of light that has been tuned to a predetermined color.

Figure 20:
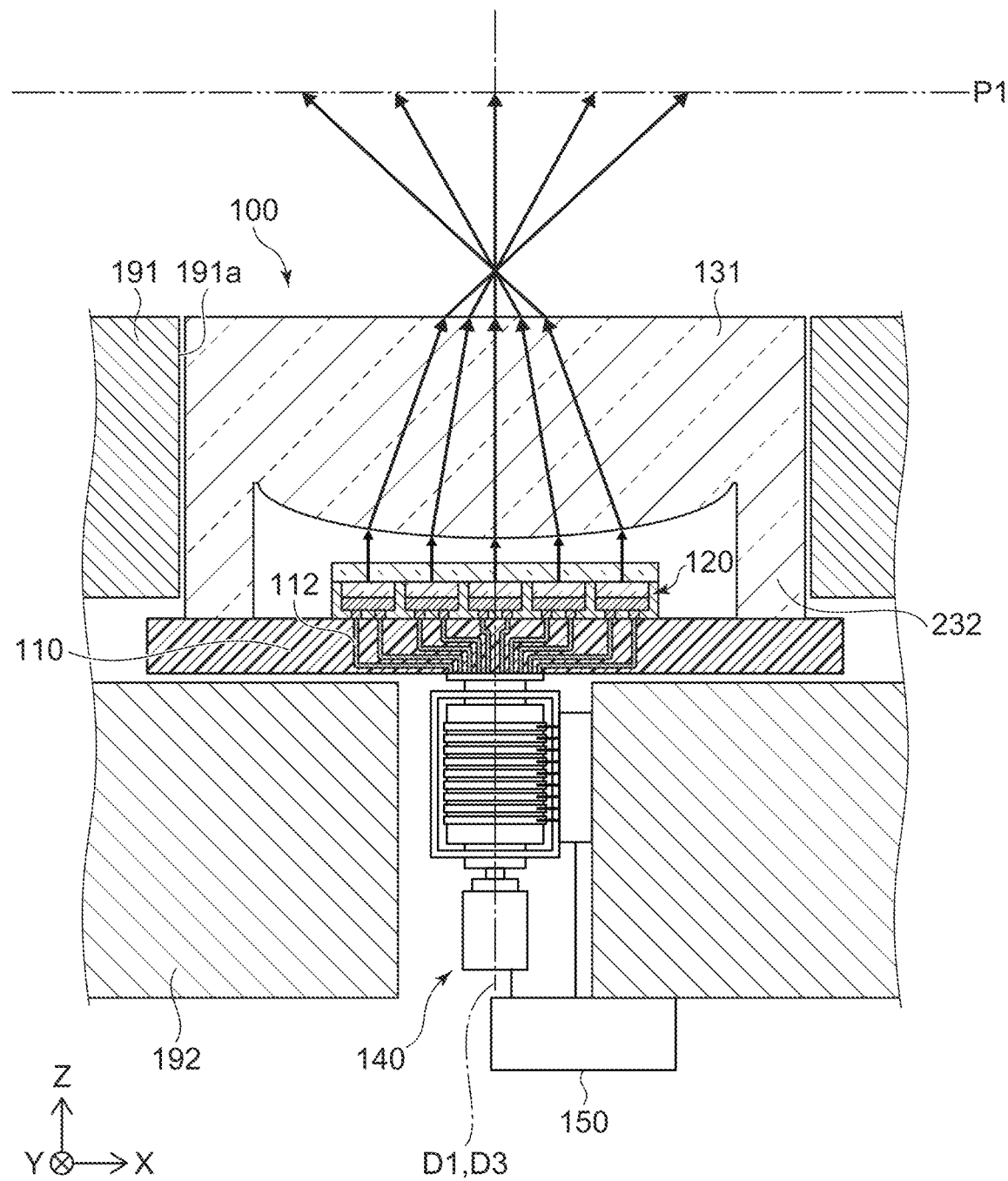
FIG. 20 is a partial cross-sectional view of a variation of the form of securing the lens.

FIG. 20 is a partial cross-sectional view of a variation of the state in which the lens is fixed.

As shown in FIG. 20, the first lens 131 may be fixed to the substrate 110 via a support portion 232. In such a case, the first lens 131 rotates with the substrate 110. As such, the first lens 131 may rotate with the substrate 110.

Figure 21:
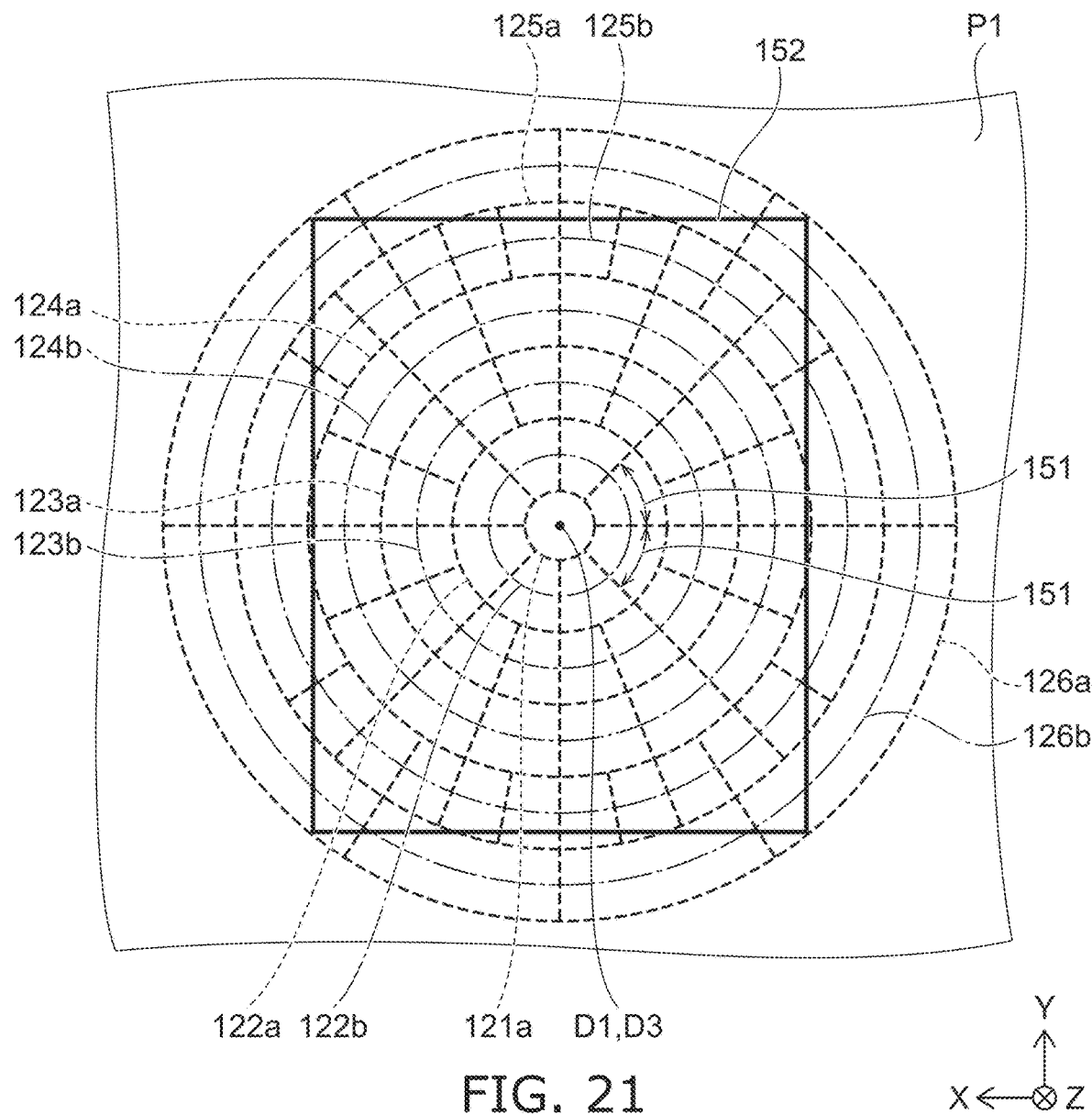
FIG. 21 is a schematic diagram of a variation of the method of controlling the light sources.

FIG. 21 is a schematic diagram showing a variation of the method of controlling multiple light sources.

FIG. 21 shows an example in which there is no overlap between any adjacent irradiating regions among the irradiating regions 121*a*, 122*a*, 123*a*, 124*a*, 125*a*, and 126*a*.

The control unit 150 controls the outputs of the light sources 120 in a similar manner to in the first embodiment.

As shown in FIG. 21, except for the first light source 121, the light emitted by each light source 122, 123, 124, 125, and 126 and exiting the first lens 131 can be divided into multiple sections 151 on the circular tracks 122*b*, 123*b*, 124*b*, 125*b*, and 126*b*, respectively. In other words, the irradiating regions 122*a*, 123*a*, 124*a*, 125*a*, and 126*a* in the irradiated plane P1 are divided into multiple sections 151. In FIG. 21, each portion of the individual circular tracks 122*b*, 123*b*, 124*b*, 125*b*, and 126*b* divided by broken lines which radially extend corresponds to a section 151. The control unit 150 may be adapted to control the output of each light source 122, 123, 124, 125, and 126 in the multiple sections 151.

For example, the first circular track 122*b* is divided into eight sections 151, the second circular track 123*b* is divided into 16 sections 151, the third circular track 124*b* is divided into 16 sections 151, the fourth circular track 125*b* is divided into 24 sections 151, and the fifth circular track 126*b* is divided into eight sections 151. The sections 151 are set to divide camera's photographing region 152 shown as a rectangle in FIG. 21. Accordingly, for the circular tracks 122*b*, 123*b*, and 124*b* which are substantially entirely located within the photographing region 152, the sections 151 are set to have substantially the same length. In contrast, for the circular tracks 125*b* and 126*b* which are partly located within and partly on the outward of the photographing region 152, because the sections 151 are set to divide the regions in the photographing region 152, the lengths of the sections 151 are not uniform. As shown by the circular track 125*b* in FIG. 21, the sections of each of the circular tracks 125*b* and 126*b* located within the photographing region 152 are preferably set to have uniform lengths. However, the numbers and lengths of the sections in each of the circular tracks are not limited to those described above.

The control unit 150 determines set output values for each of the light sources 122, 123, 124, 125, and 126 per section 151. As the substrate 110 rotates, the sections 151 irradiated by the light emitted by the light sources 122, 123, 124, 125, and 126 and exiting the first lens 131 are switched, and the control unit 150 switches the outputs of the light sources 122, 123, 124, 125, and 126 to the set values that correspond to the sections 151 after switching.

In the manner described above, the irradiating region 121*a* and the 72 sections 151 can divide the photographing region 152 into 73 brightness-adjustable regions.

The constituent elements of the embodiments and variations described above can be suitably combined to the extent that such a combination does not cause inconsistency.

The present disclosure includes the aspects described below.

[Aspect 1]
A light emitting module comprising:
 a substrate;
 a plurality of light sources fixed on the substrate and generating individually controllable outputs;
 a light shielding member disposed between the light sources;
 a first lens disposed above the light sources and on which the light emitted from each of the light sources becomes incident; and
 a drive unit capable of rotating the substrate, wherein
 the light sources include a first light source and a second light source,
 an angle formed by an axis of rotation of the substrate and an optical axis of the first light emitted by the first light source and exiting the first lens differs from an angle formed by the axis of rotation and an optical axis of second light emitted by the second light source and exiting the first lens, and
 the second light can irradiate a first circular track having the axis of rotation as its center.

[Aspect 2]
The light emitting module according to aspect 1 further including a control unit capable of controlling an output of the second light source in coordination with the drive unit.

[Aspect 3]
The light emitting module according to aspect 1 or 2 wherein
 the light sources include a third light source,
 third light emitted by the third light source and exiting the first lens can irradiate a second circular track having the axis of rotation as its center, and
 the second circular track is different from the first circular track.

[Aspect 4]
The light emitting module according to aspect 1 or 2 wherein
 the light sources include a third light source,
 third light emitted by the third light source and exiting the first lens can irradiate the first circular track, and
 a chromaticity of the third light differs from a chromaticity of the second light.

[Aspect 5]
The light emitting module according to any of aspects 1 to 4 wherein the first lens rotates with the substrate.

[Aspect 6]
The light emitting module according to any of aspects 1 to 5 wherein the first lens is a solid of revolution formed around the axis of rotation as a central axis, and an optical axis of the first lens coincides with the axis of rotation.

[Aspect 7]
The light emitting module according to any of aspects 1 to 6 wherein the light emission face of the first lens is flat.

[Aspect 8]
The light emitting module according to any of aspects 1 to 7 wherein the light incident face of the first lens is a convex face.

[Aspect 9]
The light emitting module according to any of aspects 1 to 8 wherein the first lens is a Fresnel lens in which the light incident face has a Fresnel profile.

[Aspect 10]
The light emitting module according to any of aspects 1 to 6 wherein the light incident face and the light emission face of the first lens are both convex faces.

[Aspect 11]
The light emitting module according to any of aspects 1 to 10 further comprising second lenses positioned between the first lens and the light sources, and disposed individually on the light sources.

[Aspect 12]
The light emitting module according to any of aspects 1 to 10 further comprising a second lens positioned between the first lens and the light sources, and disposed over and across all of the light sources.

[Aspect 13]
The light emitting module according to any of aspects 1 to 12 wherein, in a top view, the light sources are arranged at intersections of a plurality of first straight lines and a plurality of second straight lines,
 the plurality of first straight lines extend in a first direction and are arranged in a second direction orthogonal to the first direction, and
 the plurality of second straight lines extend in the second direction and are arranged in the first direction.

[Aspect 14]
The light emitting module according to any of aspects 1 to 12 wherein, on the substrate, the light sources are arranged on a plurality of circumferences around the axis of rotation having radii different from one another.

[Aspect 15]
The light emitting module according to any of aspects 1 to 12 wherein, in a top view, the light sources are arranged at intersections of a plurality of first straight lines and a plurality of second straight lines,
the first straight lines extend in the first direction and are arranged in the second direction orthogonal to the first direction, and
the plurality of second straight lines extend in a third direction intersecting the first direction and the second direction and are arranged in a fourth direction orthogonal to the third direction.

[Aspect 16]
The light emitting module according to any of aspects 1 to 12 wherein the light sources are arranged in a honeycomb shape.

[Aspect 17]
The light emitting module according to any of aspects 1 to 16 wherein, in a top view, a shape of each of the light sources is a hexagon.

[Aspect 18]
The light emitting module according to any of aspects 1 to 17 further comprising a light transmissive member disposed over and across all of the light sources.

[Aspect 19]
The light emitting module according to aspect 18 wherein the light transmissive member contains a light diffusing material.

INDUSTRIAL APPLICABILITY

The present disclosure can be utilized, for example, as a light source for a camera flashlight, lighting fixture, automotive headlight, or the like.

REFERENCE NUMERALS 100, 200, 300, 400, 500, 600: light emitting module
110: substrate
110a: upper face
110b: lower face
111: resin layer
112: wire
120, 121, 122, 123, 124, 125, 126, 220, 320, 420, 520, 520A, 520B, 520C, 520D: light source
120a, 220a: light emitting element
120b, 220b, 320b, 420b, 529A, 529B, 529C, 529D: wavelength conversion member
120c, 220c: semiconductor stack structure
120d, 120e, 220d, 220e: electrode
121a, 122a, 123a, 124a, 125a, 126a: irradiating region
122b, 123b, 124b, 125b, 126b: circular track
131, 331, 431: first lens
131a, 331a, 431a: light incident face
131b, 331b, 431b: light emission face
132, 232: support portion
140: drive unit
141: motor
142: shaft
150: control unit
151: section
152: photographing region
161, 261: light shielding member
162: light transmissive member
170: rotary connector
171: ring unit
171a: tubular body
171b: ring
172: brush unit
172a: brush
172b: holder
191: casing
191a: opening
192: smartphone constituent element
193: sealing member
494: cover member
580, 680: second lens
C1: center of substrate
C2: center of light source
D1: axis
D21, D22, D23, D24, D25, D26: optical axis
D3: axis of rotation
E1: circle
F1: focal point
G1, G2, G3, G21, G22, G23, G24, G25: circumference
L1: first straight line
L2, L22: second straight line
P1: irradiated plane
P2, P3: straight line
θ1, θ2, θ3, θ4, θ5, θ6: angle

The invention claimed is:

1. A light emitting module comprising:
a substrate;
a plurality of light sources fixed on the substrate and generating individually controllable outputs;
a light shielding member disposed between and in contact with the light sources, the light shielding member comprising a resin material and a light diffusing material;
a first lens disposed above the light sources and on which the light emitted from each of the light sources becomes incident; and
a drive unit capable of rotating the substrate, wherein:
the light sources include a first light source and a second light source,
an angle formed by an axis of rotation of the substrate and an optical axis of first light emitted by the first light source and exiting the first lens differs from an angle formed by the axis of rotation and an optical axis of second light emitted by the second light source and exiting the first lens, and
the second light can irradiate a first circular track having the axis of rotation as its center.

2. The light emitting module according to claim 1, further comprising a control unit capable of controlling an output of the second light source in coordination with the drive unit.

3. The light emitting module according to claim 1, wherein:
the light sources include a third light source,
third light emitted by the third light source and exiting the first lens can irradiate a second circular track having the axis of rotation as its center, and
the second circular track is different from the first circular track.

4. The light emitting module according to claim 1, wherein:
the light sources include a third light source,
third light emitted by the third light source and exiting the first lens can irradiate the first circular track, and
a chromaticity of the third light differs from a chromaticity of the second light.

5. The light emitting module according to claim 1, wherein the first lens rotates with the substrate.

6. The light emitting module according to claim 1, wherein the first lens is a solid of revolution formed around the axis of rotation as a central axis, and an optical axis of the first lens coincides with the axis of rotation.

7. The light emitting module according to claim 1, wherein the light emission face of the first lens is flat.

8. The light emitting module according to claim 1, wherein the light incident face of the first lens is a convex face.

9. The light emitting module according to claim 1, wherein the first lens is a Fresnel lens in which the light incident face has a Fresnel profile.

10. The light emitting module according to claim 1, wherein the light incident face and the light emission face of the first lens are both convex faces.

11. The light emitting module according to claim 1, further comprising second lenses positioned between the first lens and the light sources, and disposed individually on the light sources.

12. The light emitting module according to claim 1, further comprising a second lens positioned between the first lens and the light sources, and disposed over and across all of the light sources.

13. The light emitting module according to claim 1, wherein, in a top view:
the light sources are arranged at intersections of a plurality of first straight lines and a plurality of second straight lines,
the plurality of first straight lines extend in a first direction and are arranged in a second direction orthogonal to the first direction, and
the plurality of second straight lines extend in the second direction and are arranged in the first direction.

14. The light emitting module according to claim 1, wherein, on the substrate, the light sources are arranged on a plurality of circumferences around the axis of rotation having radii different from one another.

15. The light emitting module according to claim 1, wherein, in a top view:
the light sources are arranged at intersections of a plurality of first straight lines and a plurality of second straight lines,
the plurality of first straight lines extend in a first direction and are arranged in a second direction orthogonal to the first direction, and
the plurality of second straight lines extend in a third direction intersecting the first direction and the second direction and are arranged in a fourth direction orthogonal to the third direction.

16. The light emitting module according to claim 1, wherein the light sources are arranged in a honeycomb shape.

17. The light emitting module according to claim 1, wherein, in a top view, a shape of each of the light sources is a hexagon.

18. The light emitting module according to claim 1, further comprising a light transmissive member disposed over and across all of the light sources.

19. The light emitting module according to claim 18, wherein the light transmissive member contains a light diffusing material.

20. The light emitting module according to claim 1, wherein:
each of the light sources comprises a light emitting element, and a wavelength conversion member located above the light emitting element, and
the light shielding member contacts a lateral surface of the light emitting element of each light source and a lateral surface of the wavelength conversion member of each light source.

* * * * *